(12) United States Patent
Nakai et al.

(10) Patent No.: US 8,142,885 B2
(45) Date of Patent: *Mar. 27, 2012

(54) SILICON WAFER AND METHOD FOR MANUFACTURING THE SAME

(75) Inventors: Katsuhiko Nakai, Yamaguchi (JP); Sei Fukushima, Kanagawa (JP)

(73) Assignee: Siltronic AG, Munich (DE)

( * ) Notice: Subject to any disclaimer, the term of this patent is extended or adjusted under 35 U.S.C. 154(b) by 1153 days.

This patent is subject to a terminal disclaimer.

(21) Appl. No.: 11/947,021

(22) Filed: Nov. 29, 2007

(65) Prior Publication Data

US 2008/0131679 A1  Jun. 5, 2008

(30) Foreign Application Priority Data

Dec. 1, 2006 (JP) ................................ 2006-326225
Dec. 7, 2006 (JP) ................................ 2006-330914

(51) Int. Cl.
*B32B 7/02* (2006.01)

(52) U.S. Cl. ......... 428/220; 428/212; 428/218; 438/471

(58) Field of Classification Search .................. 428/212, 428/218, 220; 438/471
See application file for complete search history.

(56) References Cited

U.S. PATENT DOCUMENTS

| 3,007,848 A * | 11/1961 | Stroop ........................ 424/441 |
| 5,935,320 A | 8/1999 | Graef et al. |
| 6,893,499 B2 * | 5/2005 | Fusegawa et al. ............. 117/13 |
| 2003/0203519 A1 | 10/2003 | Kihara et al. |

FOREIGN PATENT DOCUMENTS

| EP | 0090320 A | 10/1983 |
| EP | 1313137 A | 5/2003 |
| EP | 1408540 A | 4/2004 |
| EP | 1420440 A | 5/2004 |
| EP | 1780781 A1 | 5/2007 |
| JP | 08-213403 A | 8/1996 |
| JP | 08213403 A | 8/1996 |
| JP | 2006-40980 A | 2/2006 |
| JP | 2006040980 A | 2/2006 |
| WO | 2006003812 A | 1/2006 |

OTHER PUBLICATIONS

Katsuhiko Nakai et al., "Review of Scientific Instruments", vol. 69, No. 9, Sep. 1998, pp. 3283-3289, American Institute of Physics.
English Abstract corresponding to JP 08213403A, Aug. 20, 1996.
English Abstract corresponding to JP 2006 040980A, Feb. 9, 2006.
Sueoka, K. et al., "Effect of Oxide Precipitates Sizes on the Mechanical Strength of Czochralski Silicon Wafers," Japanese Journal of Applied Physics; Japan Society of Applied Physics; Tokyo, JP, v. 36, n. 12A, Part 1, Dec. 1997, pp. 7095-7099.
Sueoka, K. et al., "Dependence of Mechanical Strength of Czochralski Silicon Wafers on the Temperature of Oxygen Precipitation Annealing," Journal of the Electrochemical Society, v. 144, n. 3, Mar. 1997, pp. 1111-1120.
Shimizu, H., et al., "Warpage of Czochralski-Grown Silicon Wafers as Affected by Oxygen Precipitation," Japanese Journal of Applied Physics; v. 24, n. 7, Jul. 1985, pp. 815-821.
Ikari, A. et al., "Defect Control in Nitrogen Doped Czochralski Silicon Crystals," Diffusion and Defect Data. Solid State Data, Part B, Solid State Phenomena, Vaduz, LI, v. 69/70, pp. 161-166.
Ueki, T. et al., "Octahedral Void Defects Observed in the Bulk of Czochralski Silicon, " Applied Physics Letters, AIP, American Institute of Physics, Melville, NY, U.S., v. 70, n. 10, Mar. 10, 1997, pp. 1248-1250.

\* cited by examiner

*Primary Examiner* — David Sample
*Assistant Examiner* — Lawrence Ferguson
(74) *Attorney, Agent, or Firm* — Brooks Kushman P.C.

(57) ABSTRACT

Silicon wafers and a process for their manufacture wherein both slip dislocation and occurrence of warpage are suppressed include heat treatment to provide wafers having plate-shaped BMDs, a density of BMDs whose diagonal lengths are in a range of 10 nm to 120 nm, of BMDs present in the bulk of the wafer at a distance of 50 μm or more is $1 \times 10^{11}/cm^3$ or more, and the density of BMDs whose diagonal lengths are 750 nm or more in the wafer bulk is $1 \times 10^7/cm^3$ or less, and the interstitial oxygen concentration is $5 \times 10^{17}$ atoms/cm$^3$ or less. The process involves low and high temperature heat treating at under defined temperature ramping rates.

17 Claims, 2 Drawing Sheets

(1)

(2)

(3)

(4)

(5)

SILICON WAFER AND METHOD FOR MANUFACTURING THE SAME

BACKGROUND OF THE INVENTION

1. Field of the Invention

The present invention relates to a silicon wafer where both slip dislocation and warpage occurrence are suppressed, and to a method for manufacturing the same.

2. Background Art

Silicon wafers used as a substrate for a semiconductor devices or the like are manufactured by slicing a silicon single-crystal ingot into wafers and performing heat treatment, mirror finishing, and other processing steps to form a finished wafer. One method for manufacturing silicon single-crystal ingots is the Czochralski method ("CZ method"), for example. The CZ method is used for the majority of silicon single-crystal ingot manufacturing because of the ease of obtaining single-crystal ingots with large diameters, and because defects can be controlled relatively easily.

A silicon single-crystal ("CZ-Si") pulled by the CZ method includes crystal defects called "grown-in defects". The CZ-Si contains interstitial oxygen in a supersaturated state, but the supersaturated oxygen causes formation of fine defects called Bulk Micro Defects (hereinafter, "BMD") in heat treatment (anneal) conducted thereafter.

In order to form a semiconductor device on a silicon wafer, it is required that no crystal defects are present in the device forming region. The reason for this requirements is that when crystal defects are present on a surface on which a circuit is formed, circuit breaks or other device problems are caused by the defects. On the other hand, it is required that the silicon wafer contains BMDs in a proper amount. This is because the BMDs serve to getter metal impurities or the like which cause semiconductor device malfunction.

In order to satisfy the abovementioned requirements, a high-temperature annealing process has been developed which induces BMDs to form inside the silicon wafer to provide an Intrinsic Gettering layer ("IG layer"), and which diminishes grown-in defects present in the surface of the silicon wafer to form a Denuded Zone ("DZ") where crystal defects are sharply reduced. Specifically, a method has been proposed for performing a high-temperature anneal on a nitrogen-doped substrate to reduce grown-in defects on the surface of the substrate, and to form BMDs including nitrogen as nuclei inside the substrate in JP-A-10-98047.

However, the oxygen concentrations in DZ layers formed on both front and back surfaces of silicon wafers in the abovementioned high-temperature anneal process are lowered considerably due to outward diffusion of oxygen during heat treatment. As a result, restraint of dislocation defect extension on the wafer front and back faces is significantly reduced, and dislocation defects ("slip defects") easily propagate into the bulk from fine flaws on the front and back surfaces created in the anneal step, which results in lowering of the strength of the silicon wafer due to propagation of slip dislocations. For example, when a silicon wafer is annealed while being supported by a heat treatment susceptor or the like, slip dislocations may often extend from the area proximate a portion of the back surface where the wafer is supported by the susceptor. Further, that slip dislocations may extend from an edge portion of the silicon wafer.

When the strength of the silicon wafer is reduced, the wafers may be damaged or broken during subsequent manufacturing steps. However, the DZ layer is essential for semiconductor device formation, and silicon wafers having DZ layers while also having excellent strength properties have been required.

In the conventional method described in JP-A-10-98047, reduction in the strength of silicon wafers has not been addressed, and therefore propagation of slip dislocations is unavoidable in silicon wafers manufactured by such methods.

JP-A-2006-40980 discloses a method for generating BMDs at a high density in order to prevent occurrence of slip dislocations. Specifically, a silicon wafer manufacturing method is disclosed where oxygen precipitation nuclei with sizes of 20 nm or less in the amount of $1 \times 10^{10}$ atoms/cm$^3$ or more are formed in the BMD layer by heat treating a substrate sliced from a silicon single-crystal ingot under an atmosphere of nitrogen gas, inert gas, or mixed gas of ammonia gas and inert gas at a temperature of 500 to 1200° C. in a range of 1 to 600 minutes, with rapid heating and cooling ramps. A silicon wafer where BMDs with a high concentration of $1 \times 10^{10}$ atoms/cm$^3$ to $1 \times 10^{12}$ atoms/cm$^3$ have been generated by repeating heat treatment steps several times, as disclosed in JP-A-08-213403.

In recent years, however, since silicon wafers have increased in diameter, and rapid temperature ramping in a Rapid Thermal Annealer ("RTA") is frequently used, in addition to the occurrence of slip dislocation, warpage generated in the wafers becomes problematic.

An illustration of slips and warpage introduced by the RTA heat treatment is shown in FIG. 1. Slips are introduced from contacting points between a wafer back face and the wafer support. The slips extend in a 110 direction, which causes wafer damage or even breakage in some cases. Warpage is a phenomenon where a wafer is deformed due to thermal strain during the RTA heat treatment. For example, hill-shaped portions and valley-shaped portions appear on a wafer of 100-plane, as shown in FIG. 1. Warpage of a silicon wafer before heat treatment is generally 10 μm or less. However, when a heat treatment such as RTA is performed on the silicon wafer, a difference in height between a hill and a valley on the silicon wafer may reach several tens of μm. When the warpage becomes large, a semiconductor device pattern cannot be accurately exposed on a wafer surface, which causes lowering of semiconductor device yield. The problem of warpage becomes especially significant when the wafer diameter reaches 200 mm or more, and it is impossible to avoid the problem only by establishing a high BMD concentration.

SUMMARY OF THE INVENTION

Therefore, a problem to be solved by the present invention is to provide a silicon wafer in which both slip dislocations and warpage are suppressed by the wafer manufacturing process, and a method for manufacturing such wafers. These and other objects have been achieved by examining wafers having BMDs with a wide distribution of $10^5$ to $10^{13}$/cm$^3$ in terms of BMD density, or 5 to 1000 nm in terms of BMD size, and through this examination, it has been surprisingly and unexpectedly discovered that occurrence of slip and warpage in a wafer manufacturing process can be significantly suppressed by controlling the density of BMDs with a predetermined size.

DETAILED DESCRIPTION OF THE PREFERRED EMBODIMENTS

Figure 1:
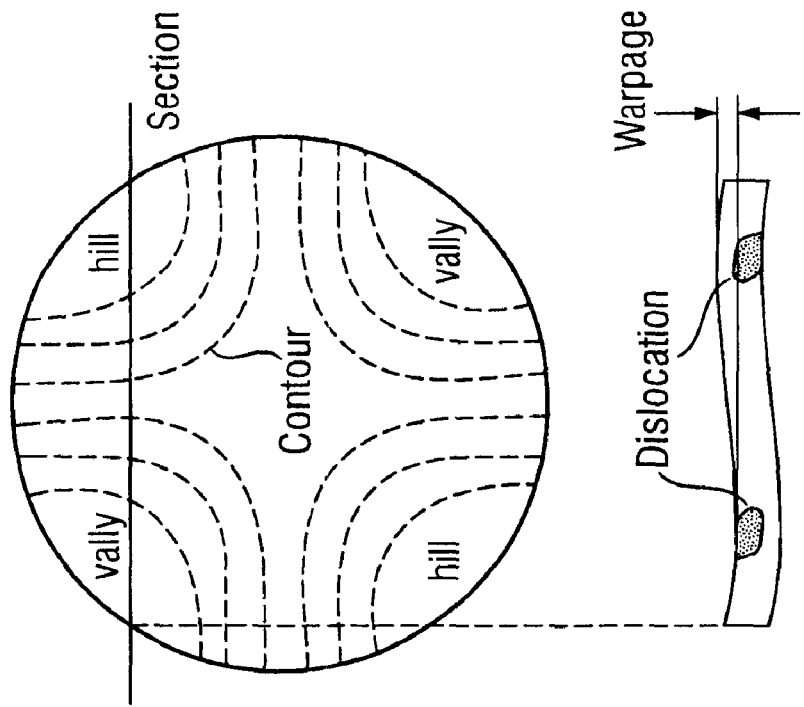
FIG. 1 is a diagram for explaining slip and warpage introduced as a result of RTA heat treatment.
Figure 1:
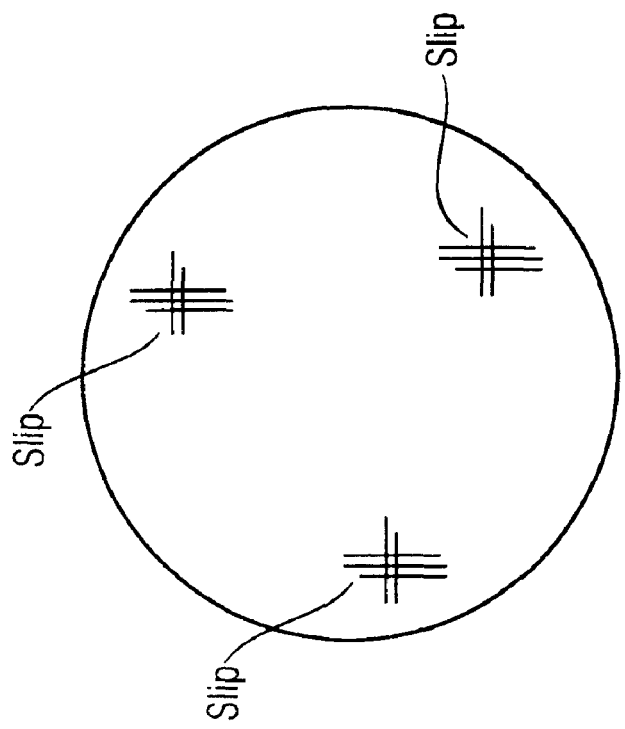
Figure 1:
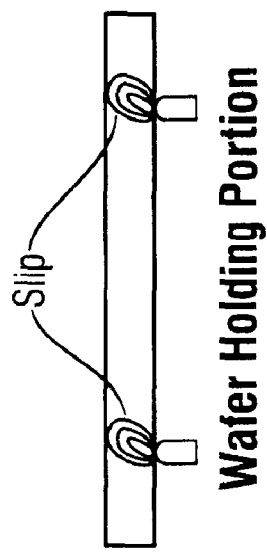

Thus, the present invention relates to a silicon wafer where BMDs with small sizes are formed in a high density, and the density of BMDs with large sizes is reduced, and preferably, interstitial oxygen concentration is further reduced, and to a method for manufacturing the same. The present invention includes the following embodiments (1) to (11). In these embodiments, the "wafer bulk" is defined as an inner portion of the wafer spaced 50 µm or more from a wafer surface.

(1) A silicon wafer where the shape of BMDs is octahedral wherein the density of BMDs whose diagonal lengths are in a range of 10 nm to 50 nm present in the wafer bulk is $5 \times 10^{11}/cm^3$ or more; the density of BMDs whose diagonal lengths are 300 nm or more present in the wafer bulk is $1 \times 10^7/cm^3$ or less, and the interstitial oxygen concentration is $5 \times 10^{17}$ atoms/$cm^3$ or less.

(2) A silicon wafer where plate-shaped BMDs and octahedral BMDs are present, wherein the density of octahedral BMDs present in the wafer bulk whose diagonal lengths are in a range of 10 nm to 50 nm is $5 \times 10^{11}/cm^3$ or more; the density of plate-shaped BMDs present in the wafer bulk whose diagonal lengths are 750 nm or more is $1 \times 10^7/cm^3$ or less, and the interstitial oxygen concentration is $5 \times 10^{17}$ atoms/$cm^3$ or less.

(3) A silicon wafer where the BMDs are plate-shaped, wherein the density of BMDs whose diagonal lengths are in a range of 10 nm to 120 nm present in the wafer bulk is $1 \times 10^{11}/cm^3$ or more, the density of BMDs whose diagonal lengths are 750 nm or more present in the wafer bulk is $1 \times 10^7/cm^3$ or less, and the interstitial oxygen concentration is $5 \times 10^{17}$ atoms/$cm^3$ or less.

(4) A method for manufacturing a silicon wafer according to embodiment (1), wherein a heat treatment performed on the substrate includes (A): a low temperature heat treatment conducted at a temperature of 600 to 750° C. for 30 minutes to 10 hours; (B): a step including temperature ramping up to 1000° C. at a rate of 0.1 to 1° C./minute for 5 to 50 hours; and (C): a high temperature heat treatment step conducted at a temperature of 1000° C. to 1250° C. such that the diffusion length of interstitial oxygen is in the range of 30 µm to 50 µm.

(5) A method for manufacturing a silicon wafer according to embodiment (1), wherein a heat treatment is performed on a substrate, the heat treatment including (A): a step of performing a heat treatment at a temperature of 600 to 750° C. for 30 minutes to 10 hours as a low temperature heat treatment step; (B): a step including temperature ramping up to 800° C. at a rate of 0.1 to 1° C./minute for 1 to 20 hours after the low temperature heat treatment step; (C): a step including ramping the temperature down at a rate of 1 to 10° C./minute, removing a substrate from the furnace at a furnace temperature between 600° C. to 800° C. and cooling the substrate down to the room temperature; and (D): a step including introducing the substrate into the furnace at a furnace temperature between 600° C. to 800° C., ramping up to 1000° C. at a rate of 1 to 10° C./minute and performing a heat treatment at a temperature of 1000° C. to 1250° C. such that a diffusion length of interstitial oxygen is in the range of 30 µm to 50 µm as a high temperature heat treatment step.

(6) A method for manufacturing a silicon wafer according to embodiment (2), wherein the nitrogen concentration in the substrate is in the range of $5 \times 10^{14}$ atoms/$cm^3$ to $1 \times 10^{16}$ atoms/$cm^3$, and a heat treatment is performed on the substrate, the heat treatment including (A): a low temperature heat treatment conducted at a temperature of 600 to 750° C. for 30 minutes to 10 hours; (B): a step including temperature ramping up to 1000° C. at a rate of 0.1 to 1° C./minute for 5 to 50 hours; and (C): a high temperature heat treatment step performed at a temperature of 1000° C. to 1250° C. such that the diffusion length of interstitial oxygen is in the range of 30 µm to 50 µm.

(7) A method for manufacturing the silicon wafer according to embodiment (2), wherein the nitrogen concentration in the substrate is in a range of $5 \times 10^{14}$ atoms/$cm^3$ to $1 \times 10^{16}$ atoms/$cm^3$, and a heat treatment is performed to the substrate, the heat treatment including (A): a step of performing a heat treatment at a temperature of 600° C. to 750° C. for 30 minutes to 10 hours as a low temperature heat treatment step; (B): a step including temperature ramping up to 800° C. at a rate of 0.1 to 1° C./minute for 1 to 20 hours; (C): a step including ramping down the furnace temperature at a rate of 1 to 10° C./minute, removing the substrate from the furnace at a furnace temperature between 600° C. to 800° C. and cooling the substrate to room temperature; and (D): a step including introducing a substrate into the furnace at a furnace temperature between 600° C. to 800° C., ramping up to 1000° C. at a rate of 1 to 10° C./minute and performing a heat treatment at a temperature of 1000° C. to 1250° C. such that a diffusion length of interstitial oxygen is in the range of 30 µm to 50 µm as a high temperature heat treatment step.

(8) A method for manufacturing a wafer according to embodiment (3), wherein a heat treatment is performed on a substrate, the heat treatment including (A): a low temperature heat treatment at a temperature of 600° C. to 750° C. for 10 minutes to 10 hours; (B): a temperature ramping up step including a step of increasing the temperature to 1000° C. at a rate of 0.1° C./minute to 1° C./minute for 5 to 50 hours; and (C): a high temperature heat treatment step conducted at a temperature of 1000° C. to 1250° C. such that a diffusion length of interstitial oxygen is in a range of 20 µm to 30 µm.

(9) A method for manufacturing a silicon wafer according to embodiment (3), wherein a heat treatment is performed on a substrate, the heat treatment including (A): a step of conducting heat treatment at a temperature of 600° C. to 750° C. for 10 minutes to 10 hours as a low temperature heat treatment step; (B): a step including temperature ramping up to 800° C. at a rate of 0.1 to 1° C./minute for 1 to 20 hours as a temperature increasing step after the low temperature heat treatment step; (C): a step including ramping down the furnace temperature at a rate of 1 to 10° C./minute, removing a substrate from the furnace at a furnace temperature between 600° C. to 800° C. and cooling the substrate to room temperature; and (D): a step including introducing a substrate into the furnace at a furnace temperature between 600° C. to 800° C. and heating up to 1000° C. at a rate of 1 to 10° C./minute and performing a heat treatment at a temperature of 1000° C. to 1250° C. such that a diffusion length of interstitial oxygen is in a range of 20 µm to 30 µm as a high temperature heat treatment step.

(10) A method for manufacturing according to embodiments (8) or (9), wherein the nitrogen concentration in the substrate is in the range of $5 \times 10^{14}$ atoms/$cm^3$ to $1 \times 10^{16}$ atoms/$cm^3$.

(11) The method for manufacturing a silicon wafer according to any of the embodiments (4) to (9), wherein the carbon concentration in the substrate is in a range of $2 \times 10^{15}$ atoms/$cm^3$ to $3 \times 10^{16}$ atoms/$cm^3$.

Figure 2:
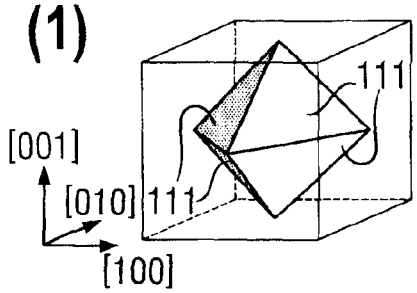
FIG. 2 is an illustrative diagram showing discrimination between octahedral and plate-shaped BMDs.
Figure 2:
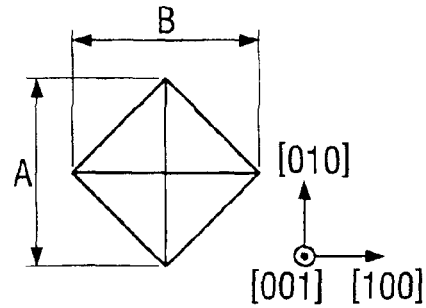
Figure 2:
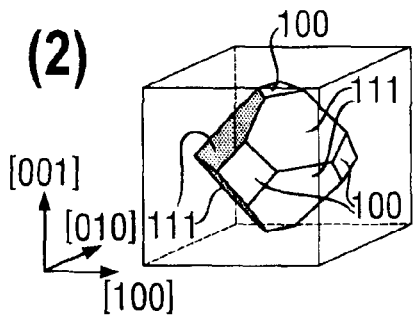
Figure 2:
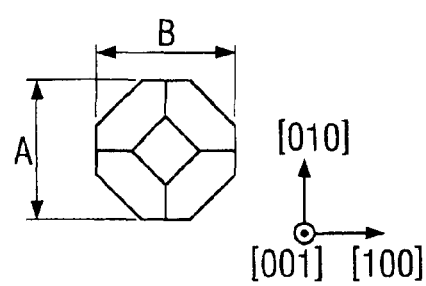
Figure 2:
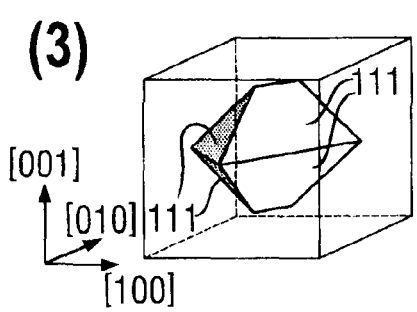
Figure 2:
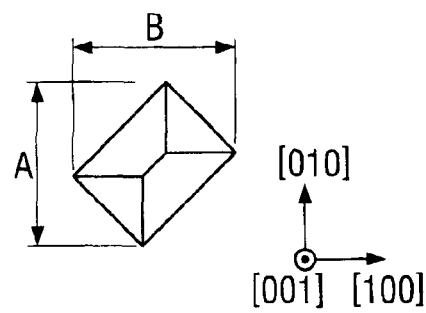
Figure 2:
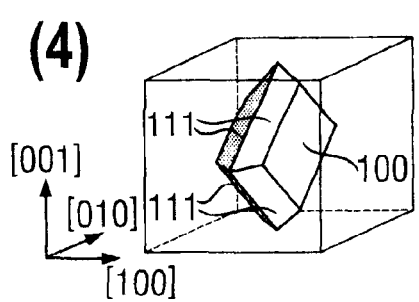
Figure 2:
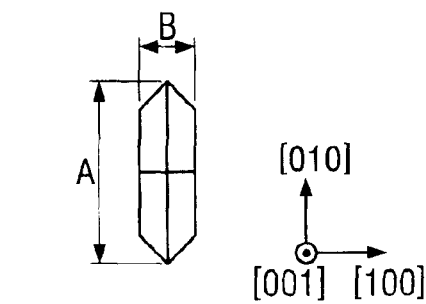
Figure 2:
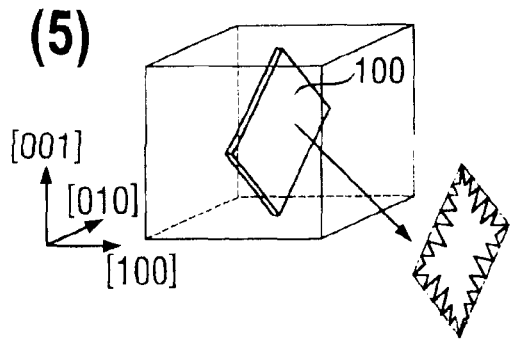
Figure 2:
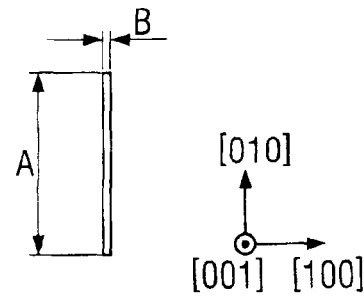

Here, in the present invention, a BMD having an octahedral shape means a BMD surrounded by a plurality of [111] planes and other planes, as shown in FIG. 2. There are generally an octahedral shape surrounded by eight faces of [111] plane, as shown in FIG. 2(1) or FIG. 2(3), and one surrounded by [100] plane together with [111] plane, as shown in FIG. 2(2). Another plane other than the [111] plane or [100] plane may appear on the BMD.

The shape of BMDs present in a wafer may be plate-shaped in addition to the octahedral shape, and a plate-shaped BMD is a BMD surrounded by relatively large two faces of [100] plane and other planes, as shown in FIG. 2(4) or FIG. 2(5). The inside of the BMD may have a dendritic shape, as shown in FIG. 2(5). Regarding discrimination between the octahedral shape and the planar shape, as shown in FIG. 2, when a longer one of sizes of [100] direction and [010] direction viewed from [001] direction is represented as A and a shorter one thereof is represented as B, A/B (hereinafter, called "ellipticity") of 1.5 or less is defined as an octahedral shape, while A/B exceeding 1.5 is defined as a plate shape. Since there are variations in BMD shape in a silicon wafer, determining whether the BMDs present in a wafer are octahedron shape or plate shaped can be made by measuring A/B of a plurality of BMDs present at different positions in a wafer to obtain an average value thereof (hereinafter, called "average ellipticity") and determining whether or not the average value exceeds 1.5. When the average value exceeds 1.5, strain applied to crystal lattice around a BMD is changed, so that an optimal BMD size distribution for suppressing occurrence of slips and warpage are changed. Further, in the present invention, the diagonal length of the BMD means the longer A of the abovementioned [100] direction and [010] directions.

The silicon wafers according to the present invention where a density of BMDs with predetermined sizes is controlled in the abovementioned manner so that occurrence of both slip and warpage is considerably suppressed, which has a DZ layer, and in which strength reduction is prevented, has a large diameter (typically, 200 mm or more), and makes it possible to manufacture devices with high quality.

The silicon wafers according to the present invention have a reduced occurrence of slip dislocation and warpage as compared with a mirror wafer which does not have BMD therein, and has high gettering ability, can reduce changes in BMD distribution during heat treatment in a device manufacturing process, and can prevent occurrence of slips and warpage due to such changes because the interstitial oxygen concentration is $5\times10^{17}$ atoms/cm$^3$ or less. Such silicon wafers can be manufactured by means of the manufacturing methods according to the invention.

The present invention will be explained in detail below.
Silicon Wafer

A silicon wafer according to the present invention is characterized in that occurrence of both of slips and warpage are suppressed such that they are present only to a considerably small extent. Neither the size (diameter and thickness) of a wafer where the present invention is realized nor presence/absence of dopants of various elements are particularly limited. These features can be properly selected according to the type of semiconductor silicon wafers required.

A semiconductor device manufactured using a silicon wafer of the present invention is not particularly limited and a silicon wafer of the present invention can be applied to manufacturing various semiconductor devices. Specifically, the silicon wafers of the present invention can be epitaxial wafers formed with an epitaxial layer on a surface thereof, a laminated SOI wafer, a SIMOX wafer which has been subjected to SIMOX (Separation By Implanted Oxygen) processes, or an SiGe wafer formed with an SiGe layer on a surface thereof, or the like.

The silicon wafers of the present invention are characterized in that where the shape of BMDs is plate-shaped or octahedral, or both plate-shaped and octahedral BMDs are present, the density of plate-shaped BMDs whose diagonal lengths are in a range of 10 nm to 120 nm present in the wafer bulk at a depth of 50 μm or more from the surface, is $1\times10^{11}$/cm$^3$ or more, and the density of octahedral BMDs whose diagonal lengths is in a range of 10 nm to 50 nm, in the wafer bulk at a depth of 50 μm or more, is $5\times10^{11}$/cm$^3$ or more. This is based upon the inventors' finding explained below.

BMDs present at a deep position 50 μm or more from the wafer surface influence the occurrences of slips or warpage, and in a silicon wafer where the BMDs having predetermined diagonal lengths are formed at a high density with a predetermined density or higher, occurrence of slips is considerably reduced. Specifically, slips generated are suppressed to 10 mm or less. Therefore, even if a slip is generated at a wafer supporting portion in a device manufacturing process, the slip is generally not exposed at the surface of the silicon wafer, and even if a slip is generated at a wafer edge portion, it generally does not reach the semiconductor device manufacturing region, so that adverse influences to devices fabricated on the wafer are prevented.

When the diagonal lengths of octahedral BMDs are less than 10 nm or the octahedral BMD density is less than $5\times10^{11}$/cm$^3$, or when diagonal lengths of plate-like BMDs are less than 10 nm or the plate-like BMD density is less than $1\times10^{11}$/cm$^3$, the BMDs do not serve as a sufficient barrier with respect to slip propagation. There is no upper limit to the diagonal length of BMDs which may serve as a barrier to slip propagation, but upper limits of ranges of the BMD diagonal length realized in an actual silicon wafers are 50 nm in the case of octahedral BMD, and 120 nm in the case of plate-like BMDs, as described as follows. When the BMDs are present at a high density, virtually all solid solution oxygen has precipitated as BMDs. Meanwhile, the number of oxygen atoms precipitating as BMDs does not exceed the number of oxygen atoms dissolved in CZ-Si as a solid solution, and thus the upper limit of the solid solution oxygen concentration is about $1\times10^{18}$ atoms/cm$^3$ at most. When BMDs are present at a high density like $1\times10^{11}$/cm$^3$ or more, it can be seen that the oxygen atoms precipitating as BMDs reaches the upper limit, and that it is almost constant (about $1\times10^{18}$ atoms/cm$^3$ in density). In this state, as the diagonal length of BMDs increases, the density of BMDs becomes smaller. Accordingly, it is impossible to realize octahedral BMDs present at a density of $5\times10^{11}$/cm$^3$ such that their diagonal lengths are more than 50 nm, and it is impossible to realize plate-like BMDs present at a density of $1\times10^{11}$/cm$^3$ such that their diagonal lengths are more than 120 nm.

Since the plate-shaped BMDs have a barrier effect to slip propagation stronger than that of the octahedral BMDs, it is expected that they can exert a slip suppression effect even at a density lower than octahedral BMDs.

When BMDs formed in a high density are plate-shaped, it is preferable that the density of the BMDs having diagonal lengths in such a range is $1\times10^{12}$/cm$^3$ or more, or the diagonal lengths of all the BMDs are 30 nm or more and the density of BMDs whose diagonal lengths are 120 nm or less is $1\times10^{11}$/cm$^3$. When BMDs formed in a high density are octahedral, it is preferable that the density of the BMDs having diagonal lengths in such a range is $1\times10^{12}$/cm$^3$ or more, or the diagonal lengths of all the BMDs are 20 nm or more and the density of BMDs whose diagonal lengths are 50 nm or less is $5\times10^{11}$/cm$^3$. Thereby, the length of a slip generated in a general device manufacturing process can be suppressed further, typically, to 5 mm or less. For devices in the current generation of design rules, when the slip length is suppressed to 10 mm or less, no problems occur. But since silicon wafers will be used up to the edge region as a device region in future generation devices with a design rule of 50 nm or less, it is desirable that the length of the slip is suppressed to 5 mm or less.

In addition to the abovementioned characteristic features, another characteristic feature of the silicon wafers of the present invention is that the density of plate-shaped BMDs in the wafer bulk at a depth greater than 50 μm whose diagonal lengths are 750 nm or more is $1 \times 10^7/cm^3$ or less. This is based upon the inventors' finding described below.

When thermal stress acts on a wafer, high-density dislocations are easily generated inside the wafer from BMDs with a large size in the wafer bulk at depths of 50 μm or more as starting points, so that the wafer is plastically deformed, causing warpage. By reducing such BMDs to a predetermined density ($1 \times 10^7/cm^3$) or less, occurrence of warpage in a general device manufacturing process can be suppressed remarkably, typically, to 20 μm or less. Plate-shaped BMDs generate fewer dislocations inside the wafer, thus causing warpage, than octahedral BMDs. Therefore, it is preferable that large BMDs are plate-shaped.

In addition to the abovementioned characteristic features, another characteristic feature of the silicon wafer of the present invention is that octahedral BMDs whose diagonal lengths are 300 nm or more present exceeding 50 μm from the wafer surface, is $1 \times 10^7/cm^3$ or less. This is based upon the inventors' finding described below.

When thermal stress acts on a wafer, high-density dislocations are easily generated inside the wafer from large-sized BMDs which are present in the bulk of the wafer at depths of 50 μm or more as starting points, so that the wafer is plastically deformed and warpage is caused. BMDs whose diagonal lengths are 300 nm or more especially serve as a generation source of dislocations, so that occurrence of warpage in a general device manufacturing process can be remarkably suppressed, typically, to 20 μm or less, by suppressing the density of such BMDs to $1 \times 10^7/cm^3$ or less.

In the silicon wafer of the present invention, it is further preferable that an average value of interstitial oxygen concentrations is reduced in addition to the characteristic features explained above. The interstitial oxygen concentration is generally measured over the entire silicon wafer, and not only the BMD layer but also the DZ layer is included in the measurement region. However, since the DZ layer is considerably thinner than the BMD layer, it can be assumed that the interstitial oxygen concentration measured over the whole silicon wafer is the same as the interstitial oxygen concentration in the BMD layer.

The reason why the interstitial oxygen concentration is specified over the whole silicon wafer in this manner is based upon the unexpected discovery that the optimal BMD distribution (size and density) explained above changes due to precipitation of interstitial oxygen depending on conditions of heat treatment in the device manufacturing process, and slips or warpage may occur due to the change. It is thus preferable that the interstitial oxygen concentration is $5 \times 10^{17}$ atoms/cm$^3$ or less in order to achieve the above objects. On the other hand, the lower limit of the interstitial oxygen concentration is around $2 \times 10^{17}$ atoms/cm$^3$. This is because heat treatment at a low temperature for a considerably long time is difficult to accomplish and it is required in order to further reduce the interstitial oxygen concentration beyond the lower limit.

It is preferable that the BMD size distribution and the interstitial oxygen concentration discussed above are realized over the whole wafer surface, but they may be realized on a partial region of the whole wafer surface depending on the application of the wafer. For example, in order to prevent only a typical slip introduced from an edge portion of a wafer, it is only required that the abovementioned BMD size distribution and interstitial oxygen concentration are realized on a region spaced from the center of a wafer of 80% or more of a wafer radius. This is because the slip introduced from an edge portion of a wafer mainly occurs on a region spaced from the center of a wafer by 80% or more in many cases. In order to prevent only typical warpage of a wafer, it is only required that the abovementioned BMD size distribution and interstitial oxygen concentration are realized on a region positioned inside by less than 80% of the wafer radius. This is because typical high-density dislocations inside the wafer causing warpage occurs in a region positioned inside of 80% or less of the wafer radius.

The silicon wafers of the present invention are remarkably excellent in that slips and warpage generated in the wafer manufacturing process are small. More specifically, the silicon wafer according to the present invention, especially, a silicon wafer where BMDs have been controlled in the above manner and whose interstitial oxygen concentration has been reduced, is characterized in that the length of a slip generated even in subsequent heat treatment is very short, typically, 10 mm or less, and the amount of warpage of the wafer after heat treatment is 20 μm or less.

As a heat treatment useful for evaluating resistance to occurrence of slips or warpage in a device manufacturing process, heat treatment may take place at a temperature in a temperature region of 700° C. to 1100° C. with heating and cooling ramp rates of 30° C./second or more and the wafer is held at a raised temperature of 1100° C. or higher. Such heat treatment is done in the temperature region where slips or warpages easily occur and thermal stress is maximized, and thus a silicon wafer where occurrence of slips and warpage is considerably reduced is obtained if these occur only within the previously disclosed ranges in this test.

For measurement of the shape of BMD, the diagonal length and the number of BMDs can be performed by ordinary known measuring methods. More specifically, such measurement includes measurement utilizing a transmission electron microscope ("TEM") and an Optical Precipitate Profiler ("OPP").

There is no limitation regarding measurement of a slip dislocation of a wafer, measurement of warpage, or their evaluation methods, and they can be measured by utilizing ordinary known methods. More specifically, an X-ray topograph can be utilized for measurement of the slip dislocation, and warpage can be evaluated by observation utilizing an FT-90A instrument manufactured by NIDEK Corporation or the like. Fourier transform infrared absorption spectroscopy (FTIR) can be used for measuring interstitial oxygen concentration.

Method for Manufacturing Silicon Wafers

The silicon wafers according to the present invention have the features disclosed above. Accordingly, any method for manufacturing a silicon wafer having such a feature can be adopted without limitation. Specifically, the silicon wafer having the abovementioned feature can be manufactured by properly controlling single-crystal growth conditions (crystal pulling-up rate, crystal cooling rate, crucible rotation, gas flow, and the like) or heat treatment conditions (heat treatment temperature, time, temperature heating and cooling ramps, and the like).

In the present invention, it is especially preferable to perform heat treatment on a substrate in a stepwise manner. Here, the term "substrate" means a silicon wafer before being subjected to heat treatment, and the substrate includes a wafer which has been sliced from a single-crystal ingot and has been subjected to steps such as chamfering, but preferably no prior heat treatment.

There are neither specific limitations about size (diameter, thickness, and the like) nor specific limitations about the presence/absence of doping with various elements, and these factors can be selected according to the type and performance of the silicon wafer required.

In the present invention, when a silicon wafer having octahedral-shaped BMDs is manufactured, the abovementioned heat treatment includes (A): a low temperature heat treatment conducted at a temperature of 600 to 750° C. for 30 minutes to 10 hours; (B): a temperature increasing step up to 1000° C. conducted at a ramp rate of 0.1° C./minute to 1° C./minute, for 5 to 50 hours; and (C): a high temperature heat treatment step conducted at a temperature of 1000° C. to 1250° C. such that the diffusion length of interstitial oxygen is in the range of 30 μm to 50 μm. When a silicon wafer with plate-shaped BMDs is manufactured, more preferably, the abovementioned heat treatment includes (A): a low temperature heat treatment conducted at a temperature of 600 to 750° C. for 10 minutes to 10 hours; (B): a temperature ramping up step to a temperature up to 1000° C. with a ramp rate of 0.1° C./minute to 1° C./minute; and (C): a high temperature heat treatment step conducted at a temperature of 1000° C. to 1250° C. such that the diffusion length of interstitial oxygen is in a range of 20 μm to 30 μm. When a silicon wafer where plate-shaped BMDs and octahedral BMDs are included in a mixed manner is manufactured, the abovementioned heat treatment includes (A): a low temperature heat treatment conducted at a temperature of 600 to 750° C. for 30 minutes to 10 hours; (B): a temperature increasing step including a step of temperature ramping up to 1000° C. at a ramping rate of 0.1° C./minute to 1° C./minute; and (C): a high temperature heat treatment step conducted at a temperature of 1000° C. to 1250° C. such that the diffusion length of interstitial oxygen is in a range of 30 μm to 50 μm.

In step (A), when the temperature in the heat treatment is less than 600° C., since diffusion of oxygen does not take place sufficiently, BMD formation cannot be sufficiently achieved, which is not preferable. On the other hand, if the temperature exceeds 750° C., BMD optimization is hardly influenced, which results in undesirable energy expenditure. When the time period for the heat treatment is short, the time for BMD nuclei formation is insufficient, and the BMD density does not reach or exceed the desired density, which is not preferable. For example, when the heat treatment time is less than 10 minutes, the BMD density is less than $1 \times 10^{11}/cm^3$, and when the time is less than 30 minutes, the BMD density is less than $5 \times 10^{11}/cm^3$. Further, when the heat treatment time exceeds 10 hours, productivity lowers, which is not preferable.

Step (B) is performed for changing the density of BMDs whose diagonal lengths are 5 nm or more to a predetermined density: when the BMDs are plate-shaped, the preferred density is $1 \times 10^{11}/cm^3$, and when the BMDs are octahedral, the preferred density is $5 \times 10^{11}/cm^3$. Step (B) is also performed for changing the interstitial oxygen concentration to $5 \times 10^{17}$ atoms/cm³ or less in the stage where the temperature has ramped up to 1000° C. When the diagonal length of BMDs is less than 5 nm, the BMDs diminish and disappear in the subsequent high temperature heat treatment (C), so that the BMD density in the silicon wafer after being subjected to the high temperature heat treatment may become less than the desired density, which is not preferable. When the density of BMDs whose diagonal lengths are 5 nm or more is less than the desired density, the BMD density in the silicon wafer after the high temperature heat treatment has been conducted may become less than the desired density, which again is not preferable. When the interstitial oxygen concentration exceeds $5 \times 10^{17}$ atoms/cm³, the interstitial oxygen concentration exceeds $5 \times 10^{17}$ atoms/cm³ even after being subjected to the high temperature heat treatment, or the plate-shaped BMD density with diagonal lengths of 750 nm or more may exceed $1 \times 10^7/cm^3$, which is not preferable. This will be because interstitial oxygen in the silicon wafer builds up at BMDs while the interstitial oxygen is externally diffused at the high temperature heat treatment (C).

In step (B), when the temperature ramping up rate is less than 0.1° C./minute, a stable temperature ramping rate cannot be obtained in view of the control parameters of the heat treatment furnace, which is not preferable. When the temperature ramping up rate exceeds 1° C./minute, BMDs produced in step (A) disappear during the period in which the temperature is rising, so that the BMD density becomes less than $5 \times 10^{11}/cm^3$ at the stage where the temperature has risen up to 1000° C., which is not preferable. When the step of conducting temperature ramping up at a temperature ramping up rate of 0.1° C./minute to 1° C./minute is conducted for less than 5 hours, BMDs produced in step (A) disappear during temperature ramping up, so that the BMD density becomes less than the predetermined density: ($1 \times 10^{11}/cm^3$ for plate-shaped BMDs, and $5 \times 10/cm^3$ for octahedral BMDs) at the point where the temperature has ramped up to 1000° C., which is not preferable. When the temperature ramping up step exceeds 50 hours, productivity is excessively reduced, which is not preferable. When the diffusion length of the interstitial oxygen is less than 5 μm, the interstitial oxygen concentration in the stage where the temperature has ramped up to 1000° C. exceeds $5 \times 10^{17}$ atoms/cm³, which is not preferable.

Measurement of the BMD density and the interstitial oxygen concentration in the stage where the temperature has ramped up to 1000° C. can be conducted after a silicon wafer is rapidly pulled out from a furnace in the stage when the heat treatment (B) has been completed and the wafer is ramped down to room temperature. A ramping down rate at this time may be a ramping down rate within a range which can be realized in an ordinary batch-type vertical furnace.

Further, step (C) is used for diffusing interstitial oxygen outwardly and forming a DZ layer. In this step, when the temperature is less than 1000° C., a long time is required for outward diffusion of interstitial oxygen, which is not preferable in view of productivity. When the temperature exceeds 1250° C., degradation of the anneal furnace is accelerated, which is not preferable. The diffusion length of the interstitial oxygen is a numerical value calculated based upon the temperature and the time at this step, and it can be specifically obtained according to the following equation (1).

$$\text{Diffusion length of interstitial oxygen } (\mu m) = 2 \times 10^4 \times (D \times \text{time (second)})^{0.5} \quad (i)$$

where, $$D \text{ (cm}^2/\text{second)} = 0.17 \times \exp(-2.53 \div 8.62 \times 10^{-5} \div \text{temperature (K)}).$$

Thus, a heat treatment where the diffusion length of interstitial oxygen becomes 20 μm or more is preferable for forming a wide DZ layer such as a width of 5 μm or more.

When the diffusion length of interstitial oxygen is less than 30 μm, the BMD shape after high temperature heat treatment (C) becomes plate-shaped, while the BMD shape becomes octahedral when the diffusion length of interstitial oxygen is equal to or greater than 30 μm. Incidentally, even when the diffusion length of interstitial oxygen is equal to or greater than 30 μm, the shape of BMDs with relatively large sizes may be formed in a plate shape, for example, by adding nitrogen, as described later. A high temperature heat treatment such that the diffusion length of interstitial oxygen exceeds 40 μm requires excessive time, resulting in lowering productivity, which is not preferable.

There is no particular limitation regarding temperature ramping up from step (B) to the step (C), where an ordinary temperature ramp rate us preferably used. The most common temperature ramp rate is in the range of 1° C./minute to 10° C./minute or so.

In the present invention, when a silicon wafer with octahedral-shaped BMDs is manufactured, the abovementioned heat treatment includes (A): a low temperature heat treatment conducted at a temperature of 600 to 750° C. for 30 minutes to 10 hours; (B): a temperature ramping up step up to 800° C. at a ramping rate of 0.1° C./minute to 1° C./minute for 1 to 10 hours; (C): a step including ramping down the furnace temperature at a ramping rate of 1 to 10° C./minute, removing a substrate from the furnace at a furnace temperature between 600° C. to 800° C. and cooling the substrate down to a room temperature; and (D): a step including introducing a substrate into the furnace at a furnace temperature between 600° C. to 800° C. and ramping up to 1000° C. at a rate of 1° C./minute to 10° C./minute and performing a heat treatment at a temperature of 1000° C. to 1250° C. such that the diffusion length of interstitial oxygen is in a range of 30 μm to 50 μm as a high temperature heat treatment step.

When a silicon wafer where plate-shaped BMDs is manufactured, the abovementioned heat treatment includes (A): a low temperature heat treatment conducted at a temperature of 600 to 750° C. for 30 minutes to 10 hours; (B): a temperature ramping up step up to 800° C. at a rate of 0.1° C./minute to 1° C./minute for 1 to 10 hours; (C): a step including ramping down the furnace temperature at a rate of 1 to 10° C./minute, removing a substrate from the furnace at a furnace temperature between 600° C. to 800° C. and cooling the substrate down to room temperature; and (D): a step including introducing a substrate into the furnace at a furnace temperature between 600° C. to 800° C. and ramping up to 1000° C. at a rate of 1° C./minute to 10° C./minute and performing a heat treatment at a temperature of 1000° C. to 1250° C. such that a diffusion length of interstitial oxygen is in the range of 30 μm to 50 μm as a high temperature heat treatment step.

When a silicon wafer where both plate-shaped BMDs and octahedral BMDs are included in a mixed manner is manufactured, the heat treatment comprises (A): a low temperature heat treatment conducted at a temperature of 600 to 750° C. for 30 minutes to 10 hours; (B): a temperature ramping up step up to 800° C. at a rate of 0.1° C./minute to 1° C./minute for 1 to 10 hours; (C): a step including ramping down the furnace temperature at a rate of 1 to 10° C./minute, removing a substrate from the furnace at a furnace temperature between 600° C. to 800° C. and cooling the substrate down to room temperature; and (D): a step including introducing a substrate into the furnace at a furnace temperature between 600° C. to 800° C. and ramping up to 1000° C. at a rate of 1° C./minute to 10° C./minute and performing heat treatment at a temperature of 1000° C. to 1250° C. such that the diffusion length of interstitial oxygen is in the range of 20 μm to 30 μm as a high temperature heat treatment step.

The reason to practice the removal step (C) is that if there are two furnaces, the heat treatments (A), (B) and the heat treatment (D) may be separately performed to increase productivity. In this case, in step (B), temperature ramping up to 800° C. at a rate of 0.1° C./minute to 1° C./minute is sufficient to achieve more of the predetermined BMD density (plate-shaped: $1 \times 10^{11}$/cm$^3$, octahedral; $5 \times 10^{11}$/cm$^3$). When the heat treatment process is divided, it is not necessary to ramp up more than 800° C. It is thought that during the step (C) BMDs which are formed after step (C) have been altered so as not to diminish in size or disappear at the step (D). Thus, it is not necessary to ramp up to 1000° C. at a rate of 0.1° C./minute to 1° C./minute like continuously processed wafers.

In step (B), when the temperature ramping up rate is less than 0.1° C./minute, a stable temperature ramp rate cannot be obtained in view of the control parameters of the heat treatment furnace, which is not preferable. When the temperature ramping up rate exceeds 1° C./minute, BMDs produced in step (A) disappear during temperature ramping up. When the time period is less than 1 hour BMDs produced in step (A) disappear during temperature ramping up, which is not preferable. When the temperature ramping up step exceeds 10 hours, productivity lowers, which again is not preferable. In this step, when the temperature is less than 800° C., BMDs might disappear.

In step (C) it is preferable to ramp down at a rate in the range of 1° C./minute to 10° C./minute which is conventionally used, and it is not preferable to remove the substrate from the furnace at a furnace temperature less than 600° C. due to shortening of the life of the heater. Likewise, it is not preferable to remove a substrate from a furnace at the furnace temperature of more than 800° C., due to deterioration of the material of the furnace. The same factors are relevant for step (D).

The temperature ramping up rate to 1000° C. is in a range of 1° C./minute to 10° C./minute, which is commonly used in a conventional furnace. There is no limitation regarding the temperature ramping down rate.

There is particularly no limitation regarding an apparatus used in the series of heat treatments explained above, and a conventionally known apparatus is preferably used. Specifically, such an apparatus may be an ordinary batch-type vertical furnace, a batch-type vertical furnace with an oxygen purging function, or the like.

In the manufacturing method of the present invention, it is preferable that the substrate contains nitrogen. This is because warpage is further suppressed to a small amount, typically, 15 μm or less, when the substrate contains nitrogen. Thus, manufacturing a device with higher performance can be made possible by further suppressing warpage. It is preferable that the concentration of nitrogen added to achieve this object is in the range of $5 \times 10^{14}$ atoms/cm$^3$ to $1 \times 10^{16}$ atoms/cm$^3$. When the concentration exceeds such a range, polycrystallization takes place so that the yield may be lower, which is not preferable.

Further, when nitrogen is added within the above concentration range, BMDs with relatively large sizes can be formed in a plate-shape even in a relatively high temperature heat treatment such that the diffusion length of interstitial oxygen becomes 30 μm or more in a temperature range of, for example, 1100° C. or more, so that the occurrence of dislocations causing warpage is reduced. Incidentally, in this case, the shape of BMDs whose sizes are relatively small and which are present in a high density is octahedral. It is thought that the effect of nitrogen on the BMD shape is minimal on such high-density BMDs.

For example, when a silicon wafer having a DZ layer with a thickness of 7 μm or more is manufactured, it is necessary to conduct a heat treatment such that the diffusion length of interstitial oxygen becomes 30 μm or more in a temperature range of 1100° C. or more. In such a case, warpage is effectively reduced when the shape of BMDs with a predetermined size or more is made plate-shaped by adding nitrogen.

In the manufacturing method of the present invention, it is preferable that the substrate contains carbon. This is because BMDs with a relatively high density can be formed even if the low temperature heat treatment of step (A) is performed at a relatively low temperature for a short time, when the substrate contains carbon.

It is preferable that the concentration of carbon added to achieve this object is in a range of $2 \times 10^{15}$ atoms/cm$^3$ to $3 \times 10^{16}$ atoms/cm$^3$. When carbon is added in an amount exceeding such a range, the interstitial oxygen content after heat treatment increases, which is not preferable. The reason is not clear, but interstitial oxygen may be prevented from agglomerating together to BMDs by carbon.

Incidentally, there is particularly no limitation regarding the method for adding nitrogen or carton to a substrate, and a conventionally known methods are preferably used. More specifically, for adding nitrogen, a substrate with a nitride film may be added to the melt when pulling up a single crystal so that the nitrogen concentration in the substrate can be adjusted. For adding carbon, carbon powder may be added to melt for pulling up a single crystal so that the carbon concentration in the substrate can be adjusted.

There is particularly no limitation regarding measuring concentrations of nitrogen, carbon, and oxygen contained in a substrate, and these are preferably measured by conventionally known methods. More specifically, the nitrogen concentration can be measured by using secondary ion mass spectrometry (SIMS). For measurement of the oxygen and carbon concentrations, measurements may be conducted by infrared absorption spectrophotometry, and the concentrations can be obtained from values of JEITA (Japan Electronics and Information Technology Industries Association) used as conversion factors.

EXAMPLES

The present invention is explained in detail below with Examples, but it is not limited to the Examples.

Method for Manufacturing Annealed Wafer and Epitaxial Wafer

Single-crystal ingots were manufactured under various conditions (wafer diameter, conduction type, oxygen concentration, nitrogen concentration, and carbon concentration). Identical sites of respective straight barrel portions of signal-crystal ingots were cut out using a wire saw, and substrates with thickness sizes of 725 to 750 μm were obtained by applying mirror finishing to the cut-out wafers. The substrates were introduced into a batch-type vertical heat treatment furnace, and first heat treatments (A and B) and a second heat treatment (C) were performed to the substrates inside the same furnace under an argon atmosphere. The conditions of respective heat treatments are as shown in 1) to 6). Annealed wafers and epitaxial wafers were manufactured in this manner. Incidentally, in the Examples, a wafer which has been subjected to heat treatment and satisfies the following conditions 1) to 6) is defined as "annealed wafer" and a wafer on which an epitaxial layer has been deposited and which satisfies the conditions 2) and 4) is defined as "epitaxial wafer". The diffusion length of interstitial oxygen in each heat treatment was obtained by integrating the abovementioned equation (i) regarding a temperature and a time according to a temperature pattern of the second heat treatment. The heat treatment conditions for each Example and Comparative Example are as follows. The epitaxial layer deposition was conducted by depositing an epitaxial layer on a surface of an annealed wafer up to a thickness of 5 μm in a vapor growth apparatus.

Table 1

First Heat treatment: after heat treatment at a temperature of 700° C. for 1 hour, the temperature was increased from 700° C. to 1000° C. at a temperature ramping rate of 1° C./minute.

Second heat treatment: the temperature was increased from 1000° C. to 1100° C. at a rate of 5° C./minute and the wafer held at a temperature of 1100° C. for 4 hours.

Cooling step: the temperature was reduced from 1100° C. to 700° C. at a rate of 1° C./minute to 5° C./minute.

Table 2

Epitaxial layer deposition after the heat treatment shown in Table 1.

Table 3

First Heat Treatment: after heat treatment at a temperature of 700° C. for 4 hours, the temperature was increased from 700° C. to 1000° C. at a rate of 1° C./minute.

Second Heat Treatment: the temperature was increased from 1000° C. to 1100° C. at a rate of 5° C./minute, then increased from 1100° C. to 1200° C. at a rate of 1° C./minute, and the substrate held at a temperature of 1200° C. for 1 hour.

Cooling step: the temperature was reduced from 1100° C. to 700° C. at a rate of 1° C./minute to 5° C./minute.

Table 4

Epitaxial layer deposition after heat treatment shown in Table 3.

Table 5

The same as heat treatment shown in Table 3.

Table 6

Epitaxial layer deposition after heat treatment shown in Table 5.

Table 7

First Heat Treatment: after heat treatment at a temperature of 700° C. for 1 hour, the temperature was increased from 700° C. to 800° C. at a rate of 1° C./minute, and then decreased from 800 to 700° C. at a rate of 2° C./minute, removing the wafer from the furnace at a temperature of 700° C., and cooling the wafer down to room temperature.

Second Heat Treatment: the wafer was inserted into the furnace at a temperature of 700° C., the temperature was increased from 700° C. to 1100° C. at a rate of 5° C./minute, and the wafer held at a temperature of 1100° C. for 4 hours.

Temperature decreasing step: temperature was decreased from 1100° C. to 700° C. at a rate of 1° C./minute to 5° C./minute.

Table 8

First heat treatment: after heat treatment at a temperature of 700° C. for 4 hours, the temperature was increased from 700° C. to 800° C. at a rate of 0.5° C./minute, then lowered from 800 to 700° C. at a temperature rate of 2° C./minute, removing the substrate from the furnace at a temperature of 700° C., and cooling the wafer down to room temperature.

Second heat treatment: inserting a substrate at a temperature of 700° C. into the furnace, increasing the temperature from 700° C. to 1100° C. at a rate of 5° C./minute, temperature ramping up/ramping down between 1000° C. and 1200° C. at a temperature ramping up/ramping down rate of 1° C./minute, and holding the substrate at a temperature of 1200° C. for 1 hour.

Temperature lowering step: lowering the temperature from 1200° C. to 700° C. at a rate of 1° C./minute to 5° C./minute.

Table 9

First heat treatment: after heat treatment at a temperature of 700° C. for 4 hours, increasing the temperature from 700° C.

to 800° C. at a rate of 0.5° C./minute, lowering the temperature from 800 to 700° C. at a temperature rate of 2° C./minute, removing the substrate from the furnace at a temperature of 700° C., and cooling the substrate down to room temperature.

Second heat treatment: inserting a substrate into the furnace at a temperature of 700° C., increasing the temperature from 700° C. to 1100° C. at a rate of 5° C./minute, increasing the temperature from 1000° C. to 1200° C. at a rate of 1° C./minute, and holding the wafer at a temperature of 1200° C. for 1 hour.

Temperature lowering step: lowering the temperature from 1200° C. to 700° C. at a rate of 1° C./minute to 5° C./minute.
Table 10

Comparative Example 1

First heat treatment: after heat treatment at a temperature of 800° C. for 4 hours, increasing the temperature from 800° C. to 1000° C. at a rate of 1° C./minute.

Second heat treatment and temperature lowering step: the same second heat treatment and temperature lowering step shown in the Examples in Table 11.

Comparative Example 2

First heat treatment: after heat treatment at a temperature of 700° C. for 1 hour, increasing the temperature from 700° C. to 1000° C. at a rate of 3° C./minute.

Second heat treatment and temperature lowering step: the same second heat treatment and temperature ramping down steps shown in the Examples in Table 1.

Comparative Example 3

First heat treatment: after heat treatment at a temperature of 700° C. for 30 minutes, increasing the temperature from 700° C. to 1000° C. at a rate of 3° C./minute.

Second heat treatment: increasing the temperature from 1000° C. to 1100° C. at a rate of 5° C./minute and holding a wafer at the temperature of 1100° C. for 1 hour.

Temperature lowering step: decreasing the temperature ramping from 1100° C. to 700° C. at a rate of 1° C./minute to 5° C./minute.

Temperature lowering step: the same temperature ramping down step shown in the Examples in Table 1.
Table 11

Comparative Example 4

First heat treatment: after heat treatment at a temperature of 700° C. for 4 hours, increasing the temperature from 700° C. to 1000° C. at a rate of 3° C./minute.

Second heat treatment and temperature lowering step: the same second heat treatment and temperature ramping down step in the Examples shown in Table 3.
Table 12

Comparative Example 5

First heat treatment: after heat treatment at a temperature of 800° C. for 4 hours, increasing the temperature from 800° C. to 1000° C. at a rate of 1° C./minute.

Second heat treatment and temperature lowering step: the same second heat treatment and temperature ramping down step in the Examples shown in Table 3.

Comparative Example 6

First heat treatment: after heat treatment at a temperature of 700° C. for 1 hour, increasing the temperature from 700° C. to 1000° C. at a rate of 3° C./minute.

Second heat treatment and temperature ramping down step: the same second heat treatment and temperature ramping down step in the Examples shown in Table 3.
Table 13

Comparative Example 7

First heat treatment: after heat treatment at a temperature of 700° C. for 1 hour, increasing the temperature from 700° C. to 750° C. at a rate of 0.5° C./minute, lowering the temperature from 750 to 700° C. at a rate of 2° C./minute, removing the wafer from the furnace at a temperature of 700° C., and cooling the wafer down to room temperature.

Second heat treatment and temperature ramping down step: the same second heat treatment and temperature ramping down step in the Examples shown in Table 7.

Comparative Example 8

First heat treatment: after heat treatment at a temperature of 700° C. for 1 hour, increasing the temperature from 700° C. to 800° C. at a rate of 2° C./minute, decreasing the temperature from 800 to 700° C. at a rate of 2° C./minute, removing the wafer from the furnace at a temperature of 700° C., and cooling the wafer down to room temperature.

Second heat treatment and temperature ramping down step: the same second heat treatment and temperature ramping down step in the Examples shown in Table 7.

Comparative Example 9

First Heat Treatment: after heat treatment at a temperature of 700° C. for 4 hours, increasing the temperature from 700° C. to 800° C. at a rate of 2° C./minute, decreasing the temperature from 800 to 700° C. at a rate of 2° C./minute, removing the wafer from furnace at the temperature of 700° C., and cooling the wafer down to room temperature.

Second heat treatment and temperature lowering step: the same second heat treatment and temperature ramping down step in the Examples shown in Table 8.

Comparative Example 10

Divisional Heat Treatment

First heat treatment: after heat treatment at a temperature of 700° C. for 4 hours, increasing temperature from 700° C. to 750° C. at a rate of 0.5° C./minute, decreasing the temperature from 750 to 700° C. at a rate of 2° C./minute, removing the wafer from the furnace at a temperature of 700° C., and cooing the wafer down to room temperature.

Second heat treatment and temperature lowering step: the same second heat treatment and temperature ramping down step in the Examples shown in Table 9.

In order to examine a BMD density and an interstitial oxygen concentration at a stage of a temperature of 1000° C., substrates manufactured under the same conditions were put in a batch-type vertical heat treatment furnace, and a wafer pulled from the furnace after only the first heat treatment was performed was prepared in a continuous heat treatment, while a wafer pulled from the furnace at a temperature of 1000° C.

after a temperature increase to 1000° C. in the second heat treatment was performed was prepared in a case of a divisional heat treatment.

Measurement and Evaluation of Annealed Wafer and Epitaxial Wafer

Measurement and evaluation of annealed wafers and epitaxial wafers obtained under the abovementioned manufacturing conditions regarding the following (1), (2), (3), and (5) were conducted. Regarding a wafer doped with nitrogen, (4) nitrogen concentration was also measured. Regarding wafers to which only the first heat treatment was conducted, (2) and (3) were also conducted (the result is shown in Table 2). TEM samples of samples used for measurements of (1) and (2) were collected from two portions of a central portion of each wafer and a portion spaced from an edge of the wafer by 10 mm by grinding each wafer to predetermined depths (50 μm, 100 μm, 300 μm) by a precise grinding machine. Measurements were conducted at a stage that focus was set to predetermined depths (50 μm, 100 μm, 300 μm) and predetermined positions (the center, a position spaced from an edge of a wafer by 10 mm) by utilizing OPP.

(1) Determination of BMD shape: The BMD ellipticity was determined from a ratio of signal intensities obtained by measuring the same measurement sample twice while a scanning direction of OPP was changed between the <110> and <100> directions. That is, a relationship between the ratio of signal intensities and the BMD ellipticity was examined in advance and the ellipticity was obtained from the ratio of signal intensities. Measurement was also conducted by TEM and the ellipticity was measured from a microscope viewed from [001] direction and obtained at this time. BMD shape determination was conducted from these results. At least 10 BMDs were measured for each sample, an average ellipticity was obtained by averaging all ellipticities of respective samples obtained thereby, and the BMD shape determination was made based upon whether or not the average ellipticity exceeded 1.5.

(2) BMD diagonal length and density: Regarding each sample, the BMD diagonal length and density were obtained by using OPP and TEM. From the observation result of BMD obtained by the method of the following 1) and 2), a density of BMDs having predetermined diagonal length was obtained. As the density of BMDs having the predetermined diagonal length, an average value of values at three points was adopted.

1) Measurement using OPP: Signal intensity obtained by electrically signal-processing phase difference of transmission laser due to BMDs was measured by using OPP manufactured by AXENT Technologies Inc. A calibration curve is as follows:

Octahedral BMD diagonal length (nm)=153×(OPP signal)$^{0.43}$

Plate-shaped BMD diagonal length (nm)=344×(OPP signal)$^{0.52}$

BMDs with a known diagonal length were measured by using OPP and a calibration curve showing a relationship between signal intensity and BMD size was prepared in advance. A diagonal length of BMD was obtained from signal intensity by using the calibration curve. When the diagonal length was obtained, Ghost Signal Removal Processing (K. Nakai Review of Scientific Instruments, vol. 69 (1998) pp. 3283) was conducted. Detection sensitivity was set to such sensitivity that BMD with a diagonal length of 80 nm or more could be measured.

2) Measurement using TEM: A density of BMDs with a predetermined diagonal length was obtained from a microscope image obtained by measurement. The density was obtained from the number of BMDs observed within a field of view and a volume of a sample corresponding to an observed region.

(3) Interstitial oxygen concentrations of annealed wafer and epitaxial wafer: The interstitial oxygen concentrations in annealed wafer and epitaxial wafer were measured by utilizing infrared absorption spectrophotometry, and values of JEITA (Japan Electronics and Information Technology Industries Association) were used as conversion factors.

(4) Nitrogen concentration of annealed wafer and epitaxial wafer: Samples were selected from an annealed wafer and an epitaxial wafer, polish up to 20 μm was conducted on the wafers in order to remove nitrogen outward diffusion layers from the surface thereof, and nitrogen concentrations in the wafers were then measured by using SIMS.

(5) Slip lengths and warpage-resistance evaluation of annealed wafer and epitaxial wafer: After the following (5)-A was performed to an annealed wafer and an epitaxial wafer, heat treatment (hereinafter, called "simulated device process heat treatment") where (5)-B was repeated ten times was performed. Warpages of the annealed wafer and the epitaxial wafer before the heat treatment and after heat treatment were measured by using FT-90A manufactured by NIDEK Corporation. The annealed wafer after the heat treatment was observed by using X-ray topography and the maximum length of the observed slip lengths was defined as a representative value.

(5)-A: Heat treatment using a vertical furnace (I): 780° C., 3 hours (II): additionally, 1000° C., 8 hours Insertion and removal were conducted at a temperature of 700° C., all the temperature heating and cooling rates were 5° C./minute, and all heat treatments were conducted under an argon atmosphere.

(5)-B: heat treatment using RTA

Insertion: room temperature

Temperature ramping up: 50° C./minute

Holding: 1100° C., 1 minute

Temperature ramping down: 30° C./minute

Pulling-out: room temperature

Atmosphere: argon

Each Measurement Result and Evaluation Result of Annealed Wafer and Epitaxial Wafer.

In Tables 1 to 6, regarding annealed wafers and epitaxial wafers manufactured under various manufacturing conditions, densities of BMDs with predetermined diagonal lengths and interstitial oxygen concentrations measured, slips and warpage amounts generated by the pseudo device process heat treatment are collectively shown as Examples and Comparative Examples. Here, the BMD density (1) shown in Table 1, Table 2, and Table 5 is a density of plate-shaped BMDs whose diagonal lengths are in a range of 10 nm to 120 nm, the BMD density (2) is a density of plate-shaped BMDs whose diagonal lengths are 750 nm or more, and the BMD density at a stage where the first heat treatment has been completed is a density of plate-shaped BMDs whose diagonal lengths are 5 nm or more. The BMD density (1) shown in Table 3, Table 4, and Table 6 is a density of octahedral BMDs whose diagonal lengths are in a range of 10 nm to 50 nm, the BMD density (2) is a density of plate-shaped BMDs whose diagonal lengths are 750 nm or more, and the BMD density at a stage where the first heat treatment has been completed is a density of plate-shaped BMDs whose diagonal lengths are 5 nm or more. The BMD density (1) shown in Table 5 and Table 6 is a density of octahedral BMDs whose diagonal lengths are in a range of 10 nm to 50 nm, the BMD density (2) is a density of octahederal BMDs whose diagonal lengths are 300 nm or more, and the BMD density at a stage where the first heat treatment has been completed is a density of octahederal BMDs whose diagonal lengths are 5 nm or more. In Examples 2 and 4, all BMD diagonal lengths were 30 nm or more, and all the BMD diagonal lengths were 20 nm or more in Examples 29, 31, 47 and 49.

All slips of wafers and warpage amounts of wafers before warpage evaluation were 10 μm or less. Nitrogen concentrations of annealed wafers and epitaxial wafers which were doped with nitrogen were the same as the nitrogen concentrations measured as grown.

In Table 1 to Table 13, regarding annealed wafers and epitaxial wafers manufactured under various manufacturing conditions, densities of BMDs with a predetermined diagonal length and interstitial oxygen concentrations measured, and slips and warpages generated in the pseudo device process heat treatment are collectively shown as Examples and Comparative Examples.

Here, the BMD densities (1) in Tables 1, table 2, Table 7, Table 10, and in Comparative Examples 7 and 8 at Table 13 are densities of plate-shaped BMDs whose diagonal lengths are in a range of 10 nm to 120 nm, the BMD densities (2) are densities of plate-shaped BMDs whose diagonal lengths are 750 nm or more, and the BMD densities at a stage that the first heat treatment has been completed and at a stage that a wafer has been taken out at a temperature of 1000° C. at the second heat treatment in a case of the divisional heat treatment are densities of plate-shaped BMDs whose diagonal lengths are 5 nm or more. Here, in Examples 2 and 4, all the BMD diagonal lengths were 30 nm or more.

The BMD density (1) Tables 3 and 4, Table 8, Table 11, and in Comparative Example 9 at Table 13 is a density of octahedral BMDs whose diagonal lengths are in a range of 10 nm to 50 nm, the BMD density (2) is a density of plate-shaped BMDs whose diagonal lengths are 750 nm or more, and the BMD densities at a stage that the first heat treatment has been completed and at a stage that a wafer has been taken out at a temperature of 1000° C. at the second heat treatment in a case of the divisional heat treatment are densities of plate-shaped BMDs whose diagonal lengths are 5 nm or more. Here, in Examples 29 and 31, all the BMD diagonal lengths were 20 nm or more.

The BMD density (1) in Table 5 Table 6, Table 9, Table 12, and in Comparative Example 10 at Table 13 is a density of octahedral BMDs whose diagonal lengths are in a range of 10 nm to 50 nm, the BMD density (2) is a density of octahedral BMDs whose diagonal lengths are 300 nm or more, and the BMD densities at a stage that the first heat treatment has been completed and at a stage that a wafer has been taken out at a temperature of 1000° C. at the second heat treatment in a case of the divisional heat treatment are densities of plate-shaped BMDs whose diagonal lengths are 5 nm or more. Here, in Examples 47 and 49, all the BMD diagonal lengths were 20 nm or more.

All slips of wafers and warpage amounts of wafers before warpage evaluation were 10 μm or less. Nitrogen concentrations of annealed wafers and epitaxial wafers which were doped with nitrogen were the same as the nitrogen concentrations measured as grown.

From these results, it is understood that, regardless of the conduction type of a silicon wafer, the plate-shaped BMD density (1) becomes $1 \times 10^{11}/cm^3$ or more and the plate-shaped BMD density (2) becomes $1 \times 10^7/cm^3$ or less, or the octahedral BMD density (1) becomes $5 \times 10^{11}/cm^3$ or more and the plate-shaped BMD density (2) becomes $1 \times 10^7/cm^3$ or less, or the octahedral BMD density (1) becomes $5 \times 10/cm^3$ or more and the octahedral BMD density (2) becomes $1 \times 10^7/cm^3$ or less, so that lengths of slips become 10 mm or less and warpage amounts are suppressed to 20 μm or even less in annealed wafers and epitaxial wafers having the respective diameters.

Further, when the plate-shaped BMD density (1) became $5 \times 10^{11}/cm^3$ or more, or the octahedral BMD density (1) became $1 \times 10^{12}/cm^3$ or more, slips were further reduced in size (5 mm or less). When the plate-shaped BMD density (1) was $1 \times 10^{11}/cm^3$ or more and all the BMDs were 30 nm or more, or the octahedral BMD density (1) was $5 \times 10^{11}/cm^3$ or more and all the BMDs were 20 nm or more, slips were made further reduced in size (5 mm or less).

Further, even if the plate-shaped BMD density (2) or the octahedral BMD density (2) is the same, the warpage amount is reduced to 15 μm or less by adding nitrogen to the substrate.

Further, from the Comparative Examples, when the plate-shaped BMD density (1) was less than $1 \times 10^{11}/cm^3$, or the octahedral BMD density (1) was less than $5 \times 10^{11}/cm^3$, as a result, the slip exceeded 10 mm. Regarding the silicon wafer, the density of BMDs whose diagonal lengths were 5 nm or more was less than $1 \times 10^{11}/cm^3$ or less, or $5 \times 10^{11}/cm^3$ or less at the stage that the first heat treatment had been completed and at the stage that the wafer had been taken out at a temperature of 1000° C. at the second heat treatment in a case of the divisional heat treatment. When the plate-shaped BMD density (2) or the octahedral BMD density (2) exceeded $1 \times 10^7/cm^3$, the warpage amount exceeded 20 μm. Regarding the silicon wafer, the interstitial oxygen concentration exceeded $5 \times 10^7$ atoms/$cm^3$ at the stage that the first heat treatment had been completed and at the stage that the wafer had been taken out at a temperature of 1000° C. at the second heat treatment in a case of the divisional heat treatment.

Further, under the heat treatment conditions in the Comparative Examples, when the plate-shaped BMD density (1) was $1 \times 10^{11}/cm^3$ or more and the plate-shaped BMD density (2) was $1 \times 10^7/cm^3$ or less, when the octahedral BMD density (1) was $5 \times 10^{11}/cm^3$ and the plate-shaped BMD density (2) was $1 \times 10^7/cm^3$ or less, or when the octahedral BMD density (1) was $5 \times 10^{11}/cm^3$ and the octahedral BMD density (2) was $1 \times 10^7/cm^3$ or less, the warpage exceeded 20 μm when the interstitial oxygen concentration exceeded $5 \times 10^{17}$ atoms/$cm^3$.

In the Examples, slip and warpage resistance evaluation tests accompanying precipitation of interstitial oxygen were conducted. In the silicon wafers according to the present invention where interstitial oxygen concentration has not been reduced, any effect of slip and warpage suppression is not apparent. But when heat treatment (for example, heat treatment at a relatively low temperature for a short time) where heat treatment does not accompany precipitation of interstitial oxygen so much is performed, occurrence of slip and warpage can be suppressed significantly even in the silicon wafer according to the present invention where the interstitial oxygen concentration has not been reduced.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

TABLE 1

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Example 1 | 200 | p | — | — | 8.0E+17 | 2.5E+11 | 4.1E+17 | 1.5E+11 | 4.4E+17 | 5 |
| Example 2 | 200 | p | — | — | 9.5E+17 | 2.9E+11 | 4.1E+17 | 4.2E+11 | 4.8E+17 | 5 |
| Example 3 | 200 | p | — | 3.0E+15 | 8.0E+17 | 1.5E+12 | 4.3E+17 | 2.3E+12 | 2.7E+17 | 5 |
| Example 4 | 200 | p | — | 2.0E+16 | 9.5E+17 | 4.6E+12 | 4.8E+17 | 3.8E+12 | 2.4E+17 | 5 |
| Example 5 | 200 | p | 5.0E+14 | — | 8.0E+17 | 4.2E+11 | 4.5E+17 | 2.0E+11 | 4.5E+17 | 5 |
| Example 6 | 200 | p | 5.0E+14 | 3.0E+15 | 8.0E+17 | 2.4E+12 | 4.1E+17 | 2.5E+12 | 2.1E+17 | 5 |
| Example 7 | 200 | p | 1.0E+15 | — | 8.0E+17 | 3.1E+11 | 4.7E+17 | 1.2E+11 | 4.5E+17 | 5 |
| Example 8 | 200 | p | 1.0E+15 | 3.0E+15 | 8.0E+17 | 1.3E+12 | 4.6E+17 | 2.8E+12 | 2.2E+17 | 5 |
| Example 9 | 300 | p | — | — | 8.0E+17 | 3.2E+11 | 3.9E+17 | 2.0E+11 | 4.7E+17 | 5 |
| Example 10 | 300 | p | 5.0E+14 | — | 8.0E+17 | 2.6E+11 | 4.3E+17 | 3.1E+11 | 3.9E+17 | 5 |
| Example 11 | 300 | p | 5.0E+14 | 2.0E+16 | 8.0E+17 | 4.5E+12 | 4.2E+17 | 4.9E+12 | 2.1E+17 | 5 |
| Example 12 | 200 | n | — | — | 8.0E+17 | 1.5E+11 | 4.8E+17 | 2.0E+11 | 4.6E+17 | 5 |
| Example 13 | 200 | n | 1.0E+15 | — | 8.0E+17 | 1.7E+11 | 4.5E+17 | 2.8E+11 | 4.4E+17 | 5 |
| Example 14 | 200 | n | 1.0E+15 | 2.0E+16 | 8.0E+17 | 3.4E+12 | 4.0E+17 | 4.0E+12 | 2.1E+17 | 5 |
| Example 15 | 300 | n | — | — | 8.0E+17 | 2.4E+11 | 4.4E+17 | 1.8E+11 | 4.4E+17 | 5 |
| Example 16 | 300 | n | 1.0E+15 | — | 8.0E+17 | 2.4E+11 | 4.5E+17 | 2.1E+11 | 4.4E+17 | 5 |
| Example 17 | 300 | n | 1.0E+15 | 2.0E+16 | 8.0E+17 | 4.4E+12 | 4.7E+17 | 3.4E+12 | 2.6E+17 | 5 |

| No. | Interstitial Oxygen Diffusion Length at second heat treatment um | Annealed Wafer or Epitaxial Wafer | | | | | | Slip mm | Warpage Amount um |
|---|---|---|---|---|---|---|---|---|---|
| | | Wafer Center Portion | | | 10 mm from Wafer Edge | | | | |
| | | BMD (/cm3) (1) | (2) | Interstitial Oxygen atoms/cm3 | BMD (/cm3) (1) | (2) | Interstitial Oxygen atoms/cm3 | | |
| Example 1 | 25 | 2.3E+11 | 4.3E+06 | 4.1E+17 | 1.4E+11 | 2.4E+06 | 4.4E+17 | 9.1 | 18 |
| Example 2 | 25 | 2.9E+11 | 4.4E+06 | 4.4E+17 | 3.6E+11 | 1.6E+06 | 4.6E+17 | 4.8 | 17 |
| Example 3 | 25 | 1.5E+12 | 6.0E+05 | 2.1E+17 | 2.0E+12 | 6.6E+05 | 2.6E+17 | 4.5 | 16 |
| Example 4 | 25 | 3.9E+12 | 6.4E+05 | 2.9E+17 | 3.6E+12 | 7.5E+05 | 2.4E+17 | 4.6 | 15 |
| Example 5 | 25 | 3.5E+11 | 4.5E+06 | 4.3E+17 | 1.9E+11 | 3.3E+06 | 4.5E+17 | 9.4 | 13 |
| Example 6 | 25 | 2.3E+12 | 5.7E+05 | 2.2E+17 | 2.2E+12 | 7.6E+05 | 2.4E+17 | 4.1 | 11 |
| Example 7 | 25 | 2.6E+11 | 6.6E+06 | 4.7E+17 | 1.1E+11 | 3.3E+06 | 4.8E+17 | 9.1 | 10 |
| Example 8 | 25 | 1.2E+12 | 5.1E+05 | 2.2E+17 | 2.3E+12 | 6.0E+05 | 2.3E+17 | 4.5 | 8 |
| Example 9 | 25 | 2.7E+11 | 5.4E+06 | 4.6E+17 | 1.9E+11 | 2.5E+06 | 4.4E+17 | 6.8 | 18 |
| Example 10 | 25 | 2.3E+11 | 1.9E+06 | 4.8E+17 | 2.7E+11 | 1.5E+06 | 4.8E+17 | 9.5 | 14 |
| Example 11 | 25 | 4.4E+12 | 7.3E+05 | 2.1E+17 | 3.4E+12 | 6.4E+05 | 2.1E+17 | 4.4 | 11 |
| Example 12 | 25 | 1.4E+11 | 1.7E+06 | 4.5E+17 | 1.8E+11 | 4.3E+06 | 4.5E+17 | 7.1 | 18 |
| Example 13 | 25 | 1.5E+11 | 4.5E+06 | 4.1E+17 | 2.8E+11 | 3.8E+06 | 4.7E+17 | 6.9 | 9 |
| Example 14 | 25 | 3.1E+12 | 6.5E+05 | 2.5E+17 | 3.8E+12 | 7.7E+05 | 2.6E+17 | 4.8 | 7 |
| Example 15 | 25 | 2.2E+11 | 5.4E+06 | 4.6E+17 | 1.8E+11 | 4.4E+06 | 4.5E+17 | 9.2 | 17 |
| Example 16 | 25 | 2.1E+11 | 2.4E+06 | 4.8E+17 | 1.8E+11 | 5.2E+06 | 4.4E+17 | 9.1 | 9 |
| Example 17 | 25 | 4.3E+12 | 5.2E+05 | 2.7E+17 | 3.3E+12 | 6.4E+05 | 2.5E+17 | 4.6 | 6 |

TABLE 2

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Example 18 | 200 | p | — | — | 8.0E+17 | 2.8E+11 | 4.8E+17 | 4.0E+11 | 4.1E+17 | 5 |
| Example 19 | 200 | p | 1.0E+15 | — | 8.0E+17 | 2.8E+11 | 4.0E+17 | 1.4E+11 | 4.4E+17 | 5 |
| Example 20 | 200 | p | 1.0E+15 | 3.0E+15 | 8.0E+17 | 2.6E+12 | 4.3E+17 | 2.9E+12 | 2.9E+17 | 5 |
| Example 21 | 300 | p | — | — | 8.0E+17 | 2.6E+11 | 4.1E+17 | 2.2E+11 | 4.5E+17 | 5 |
| Example 22 | 200 | n | — | — | 8.0E+17 | 1.3E+11 | 4.0E+17 | 1.7E+11 | 4.0E+17 | 5 |
| Example 23 | 200 | n | 1.0E+15 | — | 8.0E+17 | 3.0E+11 | 4.1E+17 | 2.6E+11 | 3.9E+17 | 5 |
| Example 24 | 200 | n | 1.0E+15 | 2.0E+16 | 8.0E+17 | 3.3E+12 | 4.3E+17 | 3.8E+12 | 2.0E+17 | 5 |
| Example 25 | 300 | n | — | — | 8.0E+17 | 3.5E+11 | 4.3E+17 | 4.2E+11 | 4.3E+17 | 5 |

TABLE 2-continued

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Example 26 | 300 | n | 1.0E+15 | — | 8.0E+17 | 4.1E+11 | 3.9E+17 | 3.8E+11 | 4.0E+17 | 5 |
| Example 27 | 300 | n | 1.0E+15 | 2.0E+16 | 8.0E+17 | 4.0E+12 | 4.1E+17 | 3.8E+12 | 2.8E+17 | 5 |

| No. | Interstitial Oxygen Diffusion Length at second heat treatment um | Annealed Wafer or Epitaxial Wafer | | | | | | Slip mm | Warpage Amount um |
|---|---|---|---|---|---|---|---|---|---|
| | | Wafer Center Portion | | | 10 mm from Wafer Edge | | | | |
| | | BMD (/cm3) (1) | (2) | Interstitial Oxygen atoms/cm3 | BMD (/cm3) (1) | (2) | Interstitial Oxygen atoms/cm3 | | |
| Example 18 | 25 | 2.30E+11 | 4.70E+06 | 4.40E+17 | 3.80E+11 | 2.20E+06 | 4.70E+17 | 7.2 | 17 |
| Example 19 | 25 | 2.60E+11 | 5.40E+06 | 4.70E+17 | 1.30E+11 | 4.60E+06 | 4.30E+17 | 7.3 | 10 |
| Example 20 | 25 | 2.20E+12 | 4.90E+05 | 2.80E+17 | 2.80E+12 | 5.20E+05 | 2.50E+17 | 4.5 | 7 |
| Example 21 | 25 | 2.40E+11 | 6.40E+06 | 4.10E+17 | 2.20E+11 | 5.00E+06 | 4.00E+17 | 9.2 | 18 |
| Example 22 | 25 | 1.10E+11 | 4.20E+06 | 4.40E+17 | 1.60E+11 | 2.90E+06 | 4.00E+17 | 8.6 | 16 |
| Example 23 | 25 | 2.80E+11 | 5.30E+06 | 4.50E+17 | 2.60E+11 | 6.50E+06 | 4.60E+17 | 9 | 9 |
| Example 24 | 25 | 3.30E+12 | 6.00E+05 | 2.70E+17 | 3.60E+12 | 6.20E+05 | 2.60E+17 | 4.5 | 7 |
| Example 25 | 25 | 3.20E+11 | 1.90E+06 | 4.00E+17 | 3.70E+11 | 4.90E+06 | 4.10E+17 | 8.3 | 18 |
| Example 26 | 25 | 3.50E+11 | 2.20E+06 | 4.30E+17 | 3.30E+11 | 1.10E+06 | 4.40E+17 | 9.7 | 9 |
| Example 27 | 25 | 3.60E+12 | 6.60E+05 | 2.80E+17 | 3.40E+12 | 6.50E+05 | 2.70E+17 | 4.8 | 6 |

TABLE 3

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Example 28 | 200 | p | 5.0E+14 | — | 8.0E+17 | 8.6E+11 | 3.9E+17 | 6.3E+11 | 4.0E+17 | 5 |
| Example 29 | 200 | p | 5.0E+14 | — | 9.5E+17 | 7.5E+11 | 4.3E+17 | 6.5E+11 | 4.8E+17 | 5 |
| Example 30 | 200 | p | 5.0E+14 | 3.00E+15 | 8.0E+17 | 1.6E+12 | 4.2E+17 | 4.0E+12 | 2.8E+17 | 5 |
| Example 31 | 200 | p | 5.0E+14 | 3.00E+15 | 9.5E+17 | 1.4E+12 | 4.5E+17 | 4.4E+12 | 2.9E+17 | 5 |
| Example 32 | 200 | p | 1.0E+15 | — | 8.0E+17 | 7.7E+11 | 4.1E+17 | 6.8E+11 | 4.1E+17 | 5 |
| Example 33 | 200 | p | 1.0E+15 | 3.00E+15 | 8.0E+17 | 2.2E+12 | 4.0E+17 | 3.3E+12 | 2.1E+17 | 5 |
| Example 34 | 300 | p | 5.0E+14 | — | 8.0E+17 | 9.2E+11 | 4.3E+17 | 6.8E+11 | 4.6E+17 | 5 |
| Example 35 | 300 | p | 5.0E+14 | 2.00E+16 | 8.0E+17 | 4.9E+12 | 4.0E+17 | 3.1E+12 | 2.7E+17 | 5 |
| Example 36 | 200 | n | 1.0E+15 | — | 8.0E+17 | 7.3E+11 | 4.3E+17 | 6.5E+11 | 3.9E+17 | 5 |
| Example 37 | 200 | n | 1.0E+15 | 2.00E+16 | 8.0E+17 | 4.4E+12 | 4.2E+17 | 3.8E+12 | 2.4E+17 | 5 |
| Example 38 | 300 | n | 1.0E+15 | — | 8.0E+17 | 8.3E+11 | 4.1E+17 | 6.7E+11 | 4.6E+17 | 5 |
| Example 39 | 300 | n | 1.0E+15 | 2.00E+16 | 8.0E+17 | 3.5E+12 | 4.5E+17 | 4.9E+12 | 2.2E+17 | 5 |

| No. | Interstitial Oxygen Diffusion Length at second heat treatment um | Annealed Wafer or Epitaxial Wafer | | | | | | Slip mm | Warpage Amount um |
|---|---|---|---|---|---|---|---|---|---|
| | | Wafer Center Portion | | | 10 mm from Wafer Edge | | | | |
| | | BMD (/cm3) (1) | (2) | Interstitial Oxygen atoms/cm3 | BMD (/cm3) (1) | (2) | Interstitial Oxygen atoms/cm3 | | |
| Example 28 | 35 | 8.3E+11 | 1.5E+06 | 3.9E+17 | 6.1E+11 | 6.6E+06 | 4.8E+17 | 8.8 | 15 |
| Example 29 | 35 | 6.3E+11 | 3.0E+06 | 4.4E+17 | 6.4E+11 | 3.3E+06 | 4.5E+17 | 4.6 | 14 |
| Example 30 | 35 | 1.4E+12 | 5.1E+05 | 2.2E+17 | 3.9E+12 | 5.6E+05 | 2.5E+17 | 4 | 11 |
| Example 31 | 35 | 1.4E+12 | 5.9E+05 | 2.1E+17 | 4.3E+12 | 6.4E+05 | 2.1E+17 | 4.2 | 12 |
| Example 32 | 35 | 7.4E+11 | 6.1E+06 | 4.1E+17 | 6.1E+11 | 2.1E+06 | 4.5E+17 | 8.4 | 9 |
| Example 33 | 35 | 2.0E+12 | 7.5E+05 | 2.5E+17 | 3.2E+12 | 7.1E+05 | 2.0E+17 | 3.9 | 6 |
| Example 34 | 35 | 8.5E+11 | 5.3E+06 | 3.9E+17 | 6.5E+11 | 5.9E+06 | 4.8E+17 | 9 | 14 |
| Example 35 | 35 | 4.7E+11 | 5.3E+05 | 2.6E+17 | 3.0E+12 | 6.9E+05 | 2.5E+17 | 4.7 | 11 |
| Example 36 | 35 | 6.8E+11 | 4.7E+06 | 4.3E+17 | 5.8E+11 | 5.4E+06 | 4.8E+17 | 8.5 | 8 |
| Example 37 | 35 | 3.9E+12 | 5.9E+05 | 2.9E+17 | 3.5E+12 | 4.9E+05 | 2.9E+17 | 4.7 | 6 |
| Example 38 | 35 | 7.2E+11 | 6.1E+06 | 4.0E+17 | 6.5E+11 | 5.5E+06 | 4.3E+17 | 9.1 | 9 |
| Example 39 | 35 | 3.4E+12 | 6.4E+05 | 2.8E+17 | 4.2E+12 | 7.7E+05 | 2.8E+17 | 4.5 | 5 |

TABLE 4

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Example 40 | 200 | p | 1.0E+15 | — | 8.0E+17 | 8.2E+11 | 4.3E+17 | 6.3E+11 | 4.2E+17 | 5 |
| Example 41 | 200 | p | 1.0E+15 | 3.0E+15 | 8.0E+17 | 2.3E+12 | 4.3E+17 | 4.1E+12 | 2.1E+17 | 5 |
| Example 42 | 200 | n | 1.0E+15 | — | 8.0E+17 | 7.4E+11 | 4.1E+17 | 6.6E+11 | 4.7E+17 | 5 |
| Example 43 | 200 | n | 1.0E+15 | 2.0E+16 | 8.0E+17 | 4.3E+12 | 3.9E+17 | 4.9E+12 | 2.8E+17 | 5 |
| Example 44 | 300 | n | 1.0E+15 | — | 8.0E+17 | 8.3E+11 | 3.9E+17 | 7.6E+11 | 4.5E+17 | 5 |
| Example 45 | 300 | n | 1.0E+15 | 2.0E+16 | 8.0E+17 | 4.9E+12 | 4.7E+17 | 4.9E+12 | 2.9E+17 | 5 |

| No. | Interstitial Oxygen Diffusion Length at second heat treatment um | Annealed Wafer or Epitaxial Wafer | | | | | | Slip mm | Warpage Amount um |
|---|---|---|---|---|---|---|---|---|---|
| | | Wafer Center Portion | | | 10 mm from Wafer Edge | | | | |
| | | BMD (/cm3) (1) | (2) | Interstitial Oxygen atoms/cm3 | BMD (/cm3) (1) | (2) | Interstitial Oxygen atoms/cm3 | | |
| Example 40 | 35 | 8.1E+11 | 4.1E+06 | 4.2E+17 | 5.8E+11 | 4.2E+06 | 4.2E+17 | 8.8 | 9 |
| Example 41 | 35 | 2.1E+12 | 6.9E+05 | 2.5E+17 | 4.0E+12 | 7.0E+05 | 2.5E+17 | 4.6 | 7 |
| Example 42 | 35 | 7.0E+11 | 4.1E+06 | 4.6E+17 | 6.0E+11 | 6.1E+06 | 4.5E+17 | 7.3 | 10 |
| Example 43 | 35 | 4.0E+12 | 5.2E+05 | 2.3E+17 | 4.1E+12 | 6.0E+05 | 2.3E+17 | 4.1 | 5 |
| Example 44 | 35 | 7.7E+11 | 6.0E+06 | 4.2E+17 | 6.5E+11 | 3.2E+06 | 3.9E+17 | 7.3 | 9 |
| Example 45 | 35 | 4.7E+12 | 7.4E+05 | 2.8E+17 | 4.8E+12 | 5.1E+05 | 2.5E+17 | 4 | 7 |

TABLE 5

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Example 46 | 200 | p | — | — | 8.00E+17 | 1.00E+12 | 4.70E+17 | 6.40E+11 | 4.80E+17 | 5 |
| Example 47 | 200 | p | — | — | 9.00E+17 | 5.30E+11 | 3.90E+17 | 5.10E+11 | 4.30E+17 | 5 |
| Example 48 | 200 | p | — | 3.00E+15 | 8.00E+17 | 2.10E+12 | 4.80E+17 | 3.60E+12 | 2.10E+17 | 5 |
| Example 49 | 200 | p | — | 2.00E+16 | 9.00E+17 | 3.50E+12 | 4.10E+17 | 4.60E+12 | 2.30E+17 | 5 |
| Example 50 | 300 | p | — | — | 8.40E+17 | 8.40E+11 | 3.90E+17 | 5.40E+11 | 4.40E+17 | 5 |
| Example 51 | 300 | p | — | 2.00E+16 | 8.00E+17 | 3.40E+12 | 4.20E+17 | 3.60E+12 | 2.50E+17 | 5 |
| Example 52 | 200 | n | — | — | 8.00E+17 | 5.60E+11 | 4.50E+17 | 5.90E+11 | 4.20E+17 | 5 |
| Example 53 | 200 | n | — | 2.00E+16 | 8.00E+17 | 4.50E+12 | 4.40E+17 | 4.60E+12 | 2.80E+17 | 5 |
| Example 54 | 300 | n | — | — | 8.00E+17 | 7.20E+11 | 4.50E+17 | 5.60E+11 | 4.30E+17 | 5 |
| Example 55 | 300 | n | — | 2.00E+16 | 8.00E+17 | 4.10E+12 | 4.80E+17 | 4.30E+12 | 2.60E+17 | 5 |

| No. | Interstitial Oxygen Diffusion Length at second heat treatment um | Annealed Wafer or Epitaxial Wafer | | | | | | Slip mm | Warpage Amount um |
|---|---|---|---|---|---|---|---|---|---|
| | | Wafer Center Portion | | | 10 mm from Wafer Edge | | | | |
| | | BMD (/cm3) (1) | (2) | Interstitial Oxygen atoms/cm3 | BMD (/cm3) (1) | (2) | Interstitial Oxygen atoms/cm3 | | |
| Example 46 | 35 | 8.30E+11 | 2.60E+06 | 4.60E+17 | 6.50E+11 | 4.20E+06 | 3.90E+17 | 8.1 | 19 |
| Example 47 | 35 | 5.20E+11 | 3.30E+06 | 4.10E+17 | 5.10E+11 | 1.10E+06 | 4.40E+17 | 4.5 | 19 |
| Example 48 | 35 | 2.00E+12 | 6.00E+05 | 2.20E+17 | 3.40E+12 | 4.90E+05 | 2.60E+17 | 3.9 | 16 |
| Example 49 | 35 | 3.10E+12 | 5.60E+05 | 2.00E+17 | 4.70E+12 | 5.20E+05 | 2.40E+17 | 4.3 | 17 |
| Example 50 | 35 | 8.30E+11 | 1.70E+06 | 4.30E+17 | 5.10E+11 | 1.70E+06 | 4.40E+17 | 7.4 | 18 |
| Example 51 | 35 | 3.60E+12 | 7.30E+05 | 2.60E+17 | 3.60E+12 | 7.70E+05 | 2.10E+17 | 4.3 | 16 |
| Example 52 | 35 | 5.40E+11 | 5.60E+06 | 3.90E+17 | 5.30E+11 | 3.10E+06 | 4.30E+17 | 9.2 | 18 |
| Example 53 | 35 | 4.40E+12 | 6.30E+05 | 2.40E+17 | 4.60E+12 | 7.60E+05 | 2.50E+17 | 4.7 | 16 |

TABLE 5-continued

| | | | | | | | | |
|---|---|---|---|---|---|---|---|---|
| Example 54 | 35 | 7.40E+11 | 5.30E+06 | 4.60E+17 | 5.30E+11 | 2.30E+06 | 4.00E+17 | 6.6 | 19 |
| Example 55 | 35 | 4.00E+12 | 7.60E+05 | 2.70E+17 | 4.30E+12 | 5.80E+05 | 2.70E+17 | 4.5 | 16 |

TABLE 6

| No. | Wafer Diameter mm | Conduction Type | Nitrogen atoms/cm3 | Carbon atoms/cm3 | Oxygen atoms/cm3 | After first heat treatment | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/ cm3 | Interstitial Oxygen atoms/cm3 | BMD/ cm3 | Interstitial Oxygen atoms/cm3 | |
| Example 56 | 200 | p | — | — | 8.0E+17 | 8.0E+11 | 4.5E+17 | 8.4E+11 | 3.9E+17 | 5 |
| Example 57 | 200 | p | — | 2.0E+16 | 8.0E+17 | 3.6E+12 | 2.3E+17 | 3.8E+12 | 2.6E+17 | 5 |
| Example 58 | 300 | p | — | — | 8.0E+17 | 7.4E+11 | 4.8E+17 | 6.3E+11 | 4.2E+17 | 5 |
| Example 59 | 300 | p | — | 2.0E+16 | 8.0E+17 | 4.1E+12 | 2.2E+17 | 3.8E+12 | 2.5E+17 | 5 |
| Example 60 | 200 | n | — | — | 8.0E+17 | 6.1E+11 | 4.6E+17 | 7.9E+11 | 4.1E+17 | 5 |
| Example 61 | 200 | n | — | 2.0E+16 | 8.0E+17 | 4.8E+12 | 2.7E+17 | 4.8E+12 | 2.8E+17 | 5 |
| Example 62 | 300 | n | — | — | 8.0E+17 | 1.2E+12 | 4.5E+17 | 7.0E+11 | 4.6E+17 | 5 |
| Example 63 | 300 | n | — | 2.0E+16 | 8.0E+17 | 4.6E+12 | 2.5E+17 | 4.1E+12 | 2.6E+17 | 5 |

| No. | Interstitial Oxygen Diffusion Length at second heat treatment um | Annealed Wafer or Epitaxial Wafer | | | | | | |
|---|---|---|---|---|---|---|---|---|
| | | Wafer Center Portion | | | 10 mm from Wafer Edge | | | |
| | | BMD (/cm3) (1) | BMD (/cm3) (2) | Interstitial Oxygen atoms/cm3 | BMD (/cm3) (1) | BMD (/cm3) (2) | Interstitial Oxygen atoms/cm3 | Slip mm | Warpage Amount um |
| Example 56 | 35 | 6.2E+11 | 3.9E+06 | 4.4E+17 | 6.7E+11 | 3.4E+06 | 4.6E+17 | 6.8 | 18 |
| Example 57 | 35 | 3.6E+12 | 5.3E+05 | 2.4E+17 | 2.9E+12 | 6.8E+05 | 2.5E+17 | 4.7 | 16 |
| Example 58 | 35 | 7.2E+11 | 5.9E+06 | 4.6E+17 | 5.3E+11 | 4.6E+06 | 4.5E+17 | 8.5 | 17 |
| Example 59 | 35 | 3.6E+12 | 5.0E+05 | 2.7E+17 | 3.3E+12 | 5.5E+05 | 2.8E+17 | 4.6 | 16 |
| Example 60 | 35 | 5.5E+11 | 6.3E+06 | 4.2E+17 | 6.1E+11 | 5.4E+06 | 4.2E+17 | 8.8 | 19 |
| Example 61 | 35 | 3.6E+12 | 5.4E+05 | 2.3E+17 | 4.8E+12 | 6.5E+05 | 2.3E+17 | 4.1 | 15 |
| Example 62 | 35 | 8.3E+11 | 6.7E+06 | 4.8E+17 | 5.8E+11 | 5.1E+06 | 4.6E+17 | 6.8 | 17 |
| Example 63 | 35 | 3.7E+12 | 6.2E+05 | 2.3E+17 | 3.6E+12 | 5.5E+05 | 2.5E+17 | 4.6 | 15 |

TABLE 7

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at second heat treatment um |
|---|---|---|---|---|---|---|---|---|---|---|
| | | | | | | Wafer Center Portion | | 10 mm from Wafer Edge | | |
| | | | | | | BMD/ cm3 | Interstitial Oxygen atoms/cm3 | BMD/ cm3 | Interstitial Oxygen atoms/cm3 | |
| Example 64 | 200 | p | — | — | 8.0E+17 | 2.5E+11 | 3.7E+17 | 1.6E+11 | 4.0E+17 | 25 |
| Example 65 | 200 | p | — | 3.0E+15 | 8.0E+17 | 1.6E+12 | 1.9E+17 | 2.2E+12 | 2.3E+17 | 25 |
| Example 66 | 200 | p | — | 2.0E+16 | 9.5E+17 | 4.3E+12 | 2.6E+17 | 4.0E+12 | 2.2E+17 | 25 |
| Example 67 | 200 | p | 1.0E+15 | — | 8.0E+17 | 2.9E+11 | 4.2E+17 | 1.2E+11 | 4.3E+17 | 25 |
| Example 68 | 200 | p | 1.0E+15 | 3.0E+15 | 8.0E+17 | 1.3E+12 | 2.0E+17 | 2.6E+12 | 2.1E+17 | 25 |

| No. | Annealed Wafer or Epitaxial Wafer | | | | | | | |
|---|---|---|---|---|---|---|---|---|
| | Wafer Center Portion | | | 10 mm from Wafer Edge | | | | |
| | BMD (/cm3) (1) | BMD (/cm3) (2) | Interstitial Oxygen atoms/cm3 | BMD (/cm3) (1) | BMD (/cm3) (2) | Interstitial Oxygen atoms/cm3 | Slip mm | Warpage Amount um |
| Example 64 | 2.3E+11 | 4.3E+06 | 4.1E+17 | 1.4E+11 | 2.4E+06 | 4.4E+17 | 9.1 | 18 |
| Example 65 | 1.5E+12 | 6.0E+05 | 2.1E+17 | 2.0E+12 | 6.6E+05 | 2.6E+17 | 4.5 | 15 |
| Example 66 | 3.9E+12 | 6.4E+05 | 2.9E+17 | 3.6E+12 | 7.5E+05 | 2.4E+17 | 4.6 | 16 |

TABLE 7-continued

| | | | | | | | | |
|---|---|---|---|---|---|---|---|---|
| Example 67 | 2.6E+11 | 6.6E+06 | 4.7E+17 | 1.1E+11 | 3.3E+06 | 4.8E+17 | 9.1 | 10 |
| Example 68 | 1.2E+12 | 5.1E+05 | 2.2E+17 | 2.3E+12 | 6.0E+05 | 2.3E+17 | 4.5 | 7 |

TABLE 8

| | | | | | | Wafer taken out at temperature of 1000° C. | | | | Interstitial Oxygen |
|---|---|---|---|---|---|---|---|---|---|---|
| | | | | | | Wafer Center Portion | | 10 mm from Wafer Edge | | Diffusion Length at |
| No. | Wafer Diameter mm | Conduction Type | Nitrogen atoms/cm3 | Carbon atoms/cm3 | Oxygen atoms/cm3 | BMD/ cm3 | Interstitial Oxygen atoms/cm3 | BMD/ cm3 | Interstitial Oxygen atoms/cm3 | second heat treatment um |
| Example 69 | 200 | p | 5.0E+14 | — | 8.0E+17 | 9.1E+11 | 3.5E+17 | 6.7E+11 | 4.3E+17 | 35 |
| Example 70 | 200 | p | 5.0E+14 | 3.0E+15 | 8.0E+17 | 1.6E+12 | 2.0E+17 | 4.3E+12 | 2.2E+17 | 35 |
| Example 71 | 200 | p | 5.0E+14 | 3.0E+15 | 9.5E+17 | 1.6E+12 | 1.9E+17 | 4.8E+12 | 1.9E+17 | 35 |
| Example 72 | 200 | p | 1.0E+15 | — | 8.0E+17 | 8.1E+11 | 3.7E+17 | 6.7E+11 | 4.0E+17 | 35 |
| Example 73 | 200 | p | 1.0E+15 | 3.0E+15 | 8.0E+17 | 2.2E+12 | 2.2E+17 | 3.5E+12 | 1.8E+17 | 35 |

| | Annealed Wafer or Epitaxial Wafer | | | | | | |
|---|---|---|---|---|---|---|---|
| | Wafer Center Portion | | | 10 mm from Wafer Edge | | | |
| | BMD (/cm3) | | Interstitial Oxygen | BMD (/cm3) | | Interstitial Oxygen | Slip | Warpage Amount |
| No. | (1) | (2) | atoms/cm3 | (1) | (2) | atoms/cm3 | mm | um |
| Example 69 | 8.3E+11 | 1.5E+06 | 3.9E+17 | 6.1E+11 | 6.6E+06 | 4.8E+17 | 8.8 | 19 |
| Example 70 | 1.4E+12 | 5.1E+05 | 2.2E+17 | 3.9E+12 | 5.6E+05 | 2.5E+17 | 4 | 13 |
| Example 71 | 1.4E+12 | 5.9E+05 | 2.1E+17 | 4.3E+12 | 6.4E+05 | 2.1E+17 | 4.2 | 14 |
| Example 72 | 7.4E+11 | 6.1E+06 | 4.1E+17 | 6.1E+11 | 2.1E+06 | 4.5E+17 | 8.4 | 8 |
| Example 73 | 2.0E+12 | 7.5E+05 | 2.5E+17 | 3.2E+12 | 7.1E+05 | 2.0E+17 | 3.9 | 6 |

TABLE 9

| | | | | | | Wafer taken out at temperature of 1000° C. | | | | Interstitial Oxygen |
|---|---|---|---|---|---|---|---|---|---|---|
| | | | | | | Wafer Center Portion | | 10 mm from Wafer Edge | | Diffusion Length at |
| No. | Wafer Diameter mm | Conduction Type | Nitrogen atoms/cm3 | Carbon atoms/cm3 | Oxygen atoms/cm3 | BMD/ cm3 | Interstitial Oxygen atoms/cm3 | BMD/ cm3 | Interstitial Oxygen atoms/cm3 | second heat treatment um |
| Example 74 | 200 | p | — | — | 8.0E+17 | 8.3E+11 | 4.4E+17 | 7.3E+11 | 3.7E+17 | 35 |
| Example 75 | 200 | p | — | — | 9.0E+17 | 9.0E+11 | 3.9E+17 | 5.5E+11 | 4.1E+17 | 35 |
| Example 76 | 200 | p | — | 3.0E+15 | 9.0E+17 | 2.3E+12 | 2.1E+17 | 3.8E+12 | 2.4E+17 | 35 |

| | Annealed Wafer or Epitaxial Wafer | | | | | | |
|---|---|---|---|---|---|---|---|
| | Wafer Center Portion | | | 10 mm from Wafer Edge | | | |
| | BMD (/cm3) | | Interstitial Oxygen | BMD (/cm3) | | Interstitial Oxygen | Slip | Warpage Amount |
| No. | (1) | (2) | atoms/cm3 | (1) | (2) | atoms/cm3 | mm | um |
| Example 74 | 7.5E+11 | 2.7E+06 | 4.9E+17 | 6.7E+11 | 4.4E+06 | 4.1E+17 | 8.6 | 19 |
| Example 75 | 8.2E+11 | 3.4E+06 | 4.3E+17 | 5.0E+11 | 1.2E+06 | 4.6E+17 | 7.2 | 18 |
| Example 76 | 2.1E+12 | 6.3E+05 | 2.3E+17 | 3.5E+12 | 5.1E+05 | 2.7E+17 | 4.1 | 17 |

TABLE 10

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Comparative Example 1 | 200 | p | — | — | 8.0E+17 | 6.5E+10 | 4.6E+17 | 6.3E+10 | 4.4E+17 | 5 |
| Comparative Example 2 | 200 | p | 5.0E+14 | 3.0E+15 | 8.0E+17 | 2.8E+11 | 6.3E+17 | 4.2E+11 | 6.0E+17 | 3 |
| Comparative Example 3 | 200 | p | — | — | 1.2E+18 | 6.4E+11 | 6.5E+17 | 7.0E+11 | 6.8E+17 | 3 |

| No. | Interstitial Oxygen Diffusion Length at second heat treatment um | Annealed Wafer or Epitaxial Wafer | | | | | | Slip mm | Warpage Amount um |
|---|---|---|---|---|---|---|---|---|---|
| | | Wafer Center Portion | | | 10 mm from Wafer Edge | | | | |
| | | BMD (/cm3) (1) | BMD (/cm3) (2) | Interstitial Oxygen atoms/cm3 | BMD (/cm3) (1) | BMD (/cm3) (2) | Interstitial Oxygen atoms/cm3 | | |
| Comparative Example 1 | 25 | 5.8E+10 | 5.6E+06 | 3.9E+17 | 5.3E+10 | 6.6E+06 | 4.1E+17 | 16.6 | 18 |
| Comparative Example 2 | 25 | 2.6E+11 | 5.8E+07 | 4.1E+17 | 3.1E+11 | 5.8E+07 | 4.7E+17 | 7 | 25 |
| Comparative Example 3 | 12 | 5.2E+11 | 2.5E+06 | 6.3E+17 | 6.7E+11 | 4.1E+06 | 5.5E+17 | 7.4 | 25 |

TABLE 11

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/cm3 | Interstitial Oxygen atoms/cm3 | BMD/cm3 | Interstitial Oxygen atoms/cm3 | |
| Comparative Example 4 | 200 | p | 1.0E+14 | 3.0E+15 | 8.0E+17 | 1.0E+12 | 6.3E+17 | 8.5E+11 | 6.0E+17 | 3 |

| No. | Interstitial Oxygen Diffusion Length at second heat treatment um | Annealed Wafer or Epitaxial Wafer | | | | | | Slip mm | Warpage Amount um |
|---|---|---|---|---|---|---|---|---|---|
| | | Wafer Center Portion | | | 10 mm from Wafer Edge | | | | |
| | | BMD (/cm3) (1) | BMD (/cm3) (2) | Interstitial Oxygen atoms/cm3 | BMD (/cm3) (1) | BMD (/cm3) (2) | Interstitial Oxygen atoms/cm3 | | |
| Comparative Example 4 | 35 | 8.1E+11 | 5.8E+07 | 4.7E+17 | 7.4E+11 | 5.8E+07 | 4.1E+17 | 9.3 | 20 |

TABLE 12

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at temperature ramping up um |
|---|---|---|---|---|---|---|---|---|---|---|
| | | | | | | Wafer Center Portion | | 10 mm from Wafer Edge | | |
| | | | | | | BMD/ cm3 | Interstitial Oxygen atoms/cm3 | BMD/ cm3 | Interstitial Oxygen atoms/cm3 | |
| Comparative Example 5 | 200 | p | — | — | 8.0E+17 | 7.4E+10 | 4.6E+17 | 9.2E+10 | 4.0E+17 | 5 |
| Comparative Example 6 | 200 | p | — | — | 1.0E+18 | 7.0E+11 | 6.5E+17 | 7.6E+11 | 6.8E+17 | 3 |

| No. | Interstitial Oxygen Diffusion Length at second heat treatment um | Annealed Wafer or Epitaxial Wafer | | | | | | |
|---|---|---|---|---|---|---|---|---|
| | | Wafer Center Portion | | | 10 mm from Wafer Edge | | | |
| | | BMD (/cm3) (1) | BMD (/cm3) (2) | Interstitial Oxygen atoms/cm3 | BMD (/cm3) (1) | BMD (/cm3) (2) | Interstitial Oxygen atoms/cm3 | Slip mm | Warpage Amount um |
| Comparative Example 5 | 35 | 5.3E+10 | 5.6E+06 | 4.6E+17 | 8.4E+10 | 5.6E+06 | 4.4E+17 | 15.2 | 16 |
| Comparative Example 6 | 35 | 5.7E+11 | 1.9E+06 | 6.2E+17 | 5.6E+11 | 1.5E+06 | 5.8E+17 | 8.5 | 24 |

TABLE 13

| No. | Wafer Diameter mm | Conduction Type | Nitrogen atoms/cm3 | Carbon atoms/cm3 | Oxygen atoms/cm3 | Wafer taken out at temperature of 1000° C. | | | | Interstitial Oxygen Diffusion Length at second heat treatment um |
|---|---|---|---|---|---|---|---|---|---|---|
| | | | | | | Wafer Center Portion | | 10 mm from Wafer Edge | | |
| | | | | | | BMD/ cm3 | Interstitial Oxygen atoms/cm3 | BMD/ cm3 | Interstitial Oxygen atoms/cm3 | |
| Comparative Example 7 | 200 | p | — | — | 8.0E+17 | 6.6E+10 | 5.0E+17 | 7.8E+10 | 6.1E+17 | 25 |
| Comparative Example 8 | 200 | p | 1.0E+14 | 3.0E+15 | 8.0E+17 | 7.7E+10 | 5.8E+17 | 8.9E+10 | 6.7E+17 | 25 |
| Comparative Example 9 | 200 | p | 1.0E+14 | 3.0E+15 | 8.0E+17 | 3.5E+10 | 5.6E+17 | 3.1E+10 | 6.4E+17 | 35 |
| Comparative Example 10 | 200 | p | — | — | 8.0E+17 | 2.1E+11 | 7.4E+17 | 3.4E+11 | 6.1E+17 | 35 |

| No. | Annealed Wafer or Epitaxial Wafer | | | | | | |
|---|---|---|---|---|---|---|---|
| | Wafer Center Portion | | | 10 mm from Wafer Edge | | | |
| | BMD (/cm3) (1) | BMD (/cm3) (2) | Interstitial Oxygen atoms/cm3 | BMD (/cm3) (1) | BMD (/cm3) (2) | Interstitial Oxygen atoms/cm3 | Slip mm | Warpage Amount um |
| Comparative Example 7 | 6.0E+10 | 2.1E+07 | 5.6E+17 | 7.1E+10 | 4.2E+07 | 6.8E+17 | 12 | 25 |
| Comparative Example 8 | 7.0E+10 | 3.2E+07 | 6.4E+17 | 8.1E+10 | 4.1E+07 | 7.4E+17 | 14.2 | 26 |
| Comparative Example 9 | 3.2E+10 | 6.8E+07 | 6.2E+17 | 2.8E+10 | 5.6E+07 | 7.1E+17 | 13.1 | 28 |
| Comparative Example 10 | 1.2E+11 | 2.1E+07 | 6.1E+17 | 1.3E+11 | 2.3E+07 | 5.6E+17 | 14.1 | 25 |

What is claimed is:

1. A heat treated silicon wafer containing BMDs having a shape, exhibiting reduced occurrence of slips and warpage, and having an interstitial oxygen concentration of $5\times10^{17}$ atoms/cm$^3$ or less, comprising a wafer
    a) wherein the shape of BMDs in the wafer is octahedral, and
    the density of BMDs whose diagonal lengths are in a range of 10 nm to 50 nm in the bulk of the wafer at a distance of 50 μm or more from a wafer surface is $5\times10^{11}$/cm$^3$ or more, and
    the density of BMDs whose diagonal lengths are 300 nm or more in the bulk of the wafer at a distance of 50 μm or more from the wafer surface, is $1\times10^7$/cm$^3$ or less,
    b) both plate-shaped BMDs and octahedral BMDs are present, and
    the density of octahedral BMDs whose diagonal lengths are in a range of 10 nm to 50 nm in the bulk of the wafer at a distance of 50 μm or more from the wafer surface is $5\times10^{11}$/cm$^3$ or more, and
    the density of plate-shaped BMDs whose diagonal lengths are 750 nm or more in the wafer bulk at a distance of 50 μm or more from the wafer surface, are $1\times10^7$/cm$^3$ or less, or
    c) the BMDs are plate-shaped, and
    the density of BMDs whose diagonal lengths are in a range of 10 nm to 120 nm in the bulk of the wafer at a distance of 50 μm or more from the wafer surface is $1\times10^{11}$/cm$^3$ or more, and
    the density of BMDs whose diagonal lengths are 750 nm or more in the bulk of the wafer at a distance of 50 μm or more from the wafer surface, is $1\times10^7$/cm$^3$ or less.

2. A method for manufacturing a silicon wafer according to a) of claim 1, comprising heat treating the wafer with a heat treatment comprising
    (A): a low temperature heat treatment conducted at a temperature of 600 to 750° C. for 30 minutes to 10 hours;
    (B): a step of increasing the temperature to 1000° C. at a rate of 0.1 to 1° C./minute for 5 to 50 hours; and
    (C): a high temperature heat treatment step conducted at a temperature of 1000° C. to 1250° C. such that the diffusion length of interstitial oxygen is in a range of 30 μm to 50 μm.

3. A method for manufacturing a silicon wafer according to a) of claim 1, comprising heat treating the wafer with a heat treatment comprising
    (A): a step of performing a heat treatment at a temperature between 600 and 750° C. for 30 minutes to 10 hours as a low temperature heat treatment step;
    (B): a step of increasing the temperature to 800° C. at a rate of 0.1 to 1° C./minute for 1 to 20 hours as a temperature increasing step after the low temperature heat treatment step;
    (C): a step of decreasing a furnace temperature at a rate of 1 to 10° C./minute, removing a substrate from the furnace at a furnace temperature between 600° C. to 800° C. and cooling the substrate down to room temperature; and
    (D): a step of introducing the substrate into the furnace at a furnace temperature between 600° C. to 800° C. and ramping up to 1000° C. at a rate of 1 to 10° C./minute and performing a heat treatment at a temperature of 1000° C. to 1250° C. such that a diffusion length of interstitial oxygen is in a range of 30 μm to 50 μm as a high temperature heat treatment step.

4. A method for manufacturing the silicon wafer according to b) of claim 1, wherein
    the silicon wafer has a nitrogen concentration in a range of $5\times10^{14}$ atoms/cm$^3$ to $1\times10^{16}$ atoms/cm$^3$, and heat treating the wafer by a heat treatment comprising
    (A): a low temperature heat treatment conducted at a temperature of 600 to 750° C. for 30 minutes to 10 hours;
    (B): a step of increasing the temperature to 1000° C. at a rate of 0.1 to 1° C./minute for 5 to 50 hours; and
    (C): a high temperature heat treatment step performed at a temperature of 1000° C. to 1250° C. such that a diffusion length of interstitial oxygen is in a range of 30 μm to 50 μm.

5. A method for manufacturing the silicon wafer according to b) of claim 1, wherein
    the nitrogen concentration of the wafer is in a range of $5\times10^{14}$ atoms/cm$^3$ to $1\times10^{16}$ atoms/cm$^3$, and
    heat treating the silicon wafer by a heat treatment comprising:
    (A): a step of performing a heat treatment at a temperature of 600° C. to 750° C. for 30 minutes to 10 hours as a low temperature heat treatment step;
    (B): a step of increasing the temperature to 800° C. at a rate of 0.1 to 1° C./minute for 1 to 20 hours;
    (C): a step of decreasing a furnace temperature at a rate of 1 to 10° C./minute, removing a substrate from the furnace at a furnace temperature between 600° C. to 800° C. and cooling the substrate down to room temperature; and
    (D): a step of introducing a substrate into the furnace at a furnace temperature between 600° C. to 800° C. and ramping up to 1000° C. at a rate of 1 to 10° C./minute and performing a heat treatment at a temperature of 1000° C. to 1250° C. such that a diffusion length of interstitial oxygen is in a range of 30 μm to 50 μm as a high temperature heat treatment step.

6. A method for manufacturing the silicon wafer according to c) of claim 1, comprising
    heat treating the wafer by a heat treatment comprising
    (A): a low temperature heat treatment for performing a heat treatment at a temperature of 600° C. to 750° C. for 10 minutes to 10 hours;
    (B): a step of increasing the temperature to 1000° C. at a rate of 0.1° C./minute to 1 C.°/minute for 5 to 50 hours; and
    (C): a high temperature heat treatment step conducted at a temperature of 1000° C. to 1250° C. such that a diffusion length of interstitial oxygen is in a range of 20 μm to 30 μm.

7. A method for manufacturing a silicon wafer according to c) of claim 1, wherein
    heat treating the wafer by a heat treatment comprising:
    (A): a step of conducting heat treatment at a temperature of 600° C. to 750° C. for 10 minutes to 10 hours as a low temperature heat treatment step;
    (B): a step of increasing the temperature to 800° C. at a rate of 0.1 to 1° C./minute for 1 to 20 hours as a temperature increasing step after the low temperature heat treatment step;
    (C): a step including ramping down a furnace temperature at a rate of 1 to 10° C./minute, removing a substrate from the furnace at a furnace temperature between 600° C. to 800° C. and cooling the substrate down to room temperature; and (D): a step including introducing a substrate into the furnace at a furnace temperature between 600° C. to 800° C. and ramping up to 1000° C. at a rate of 1 to 10° C./minute and performing a heat treatment at a temperature of 1000° C. to 1250° C. such that a diffusion length of interstitial oxygen is in a range of 20 μm to 30 μm as a high temperature heat treatment step.

8. The method for manufacturing a silicon wafer according to claim 6, wherein
a nitrogen concentration in the substrate is in a range of $5 \times 10^{14}$ atoms/cm$^3$ to $1 \times 10^{16}$ atoms/cm$^3$.

9. The method for manufacturing a silicon wafer according to claim 7, wherein
a nitrogen concentration in the substrate is in a range of $5 \times 10^{14}$ atoms/cm$^3$ to $1 \times 10^{16}$ atoms/cm$^3$.

10. The method for manufacturing a silicon wafer according to claim 2, wherein
a carbon concentration in the substrate is in a range of $2 \times 10^{15}$ atoms/cm$^3$ to $3 \times 10^{16}$ atoms/cm$^3$.

11. The method for manufacturing a silicon wafer according to claim 4, wherein
a carbon concentration in the substrate is in a range of $2 \times 10^{15}$ atoms/cm$^3$ to $3 \times 10^{16}$ atoms/cm$^3$.

12. The method for manufacturing a silicon wafer according to claim 5, wherein
a carbon concentration in the substrate is in a range of $2 \times 10^{15}$ atoms/cm$^3$ to $3 \times 10^{16}$ atoms/cm$^3$.

13. The method for manufacturing a silicon wafer according to claim 6, wherein
a carbon concentration in the substrate is in a range of $2 \times 10^{15}$ atoms/cm$^3$ to $3 \times 10^{16}$ atoms/cm$^3$.

14. The method for manufacturing a silicon wafer according to claim 9, wherein
a carbon concentration in the substrate is in a range of $2 \times 10^{15}$ atoms/cm$^3$ to $3 \times 10^{16}$ atoms/cm$^3$.

15. A silicon wafer of claim 1, wherein the shape of BMDs in the wafer is octahedral, and
the density of BMDs whose diagonal lengths are in a range of 10 nm to 50 nm in the bulk of the wafer at a distance of 50 μm or more from a wafer surface is $5 \times 10^{11}$/cm$^3$ or more, and
the density of BMDs whose diagonal lengths are 300 nm or more in the bulk of the wafer at a distance of 50 μm or more from the wafer surface, is $1 \times 10^{7}$/cm$^3$ or less.

16. A silicon wafer of claim 1, wherein both plate-shaped BMDs and octahedral BMDs are present, and
the density of octahedral BMDs whose diagonal lengths are in a range of 10 nm to 50 nm in the bulk of the wafer at a distance of 50 μm or more from the wafer surface is $5 \times 10^{11}$/cm$^3$ or more, and
the density of plate-shaped BMDs whose diagonal lengths are 750 nm or more in the wafer bulk at a distance of 50 μm or more from the wafer surface, are $1 \times 10^{7}$/cm$^3$ or less.

17. A silicon wafer of claim 1, wherein the BMDs are plate-shaped, and
the density of BMDs whose diagonal lengths are in a range of 10 nm to 120 nm in the bulk of the wafer at a distance of 50 μm or more from the wafer surface is $1 \times 10^{11}$/cm$^3$ or more, and
the density of BMDs whose diagonal lengths are 750 nm or more in the bulk of the wafer at a distance of 50 μm or more from the wafer surface, is $1 \times 10^{7}$/cm$^3$ or less.

* * * * *